United States Patent
Huang et al.

(10) Patent No.: US 11,640,989 B2
(45) Date of Patent: May 2, 2023

(54) SEMICONDUCTOR DEVICE STRUCTURE WITH METAL GATE STACK

(71) Applicant: Taiwan Semiconductor Manufacturing Company, Ltd., Hsinchu (TW)

(72) Inventors: Wang-Chun Huang, Kaohsiung (TW); Ching-Wei Tsai, Hsinchu (TW); Kuan-Lun Cheng, Hsin-Chu (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/665,925

(22) Filed: Feb. 7, 2022

(65) Prior Publication Data

US 2022/0157967 A1 May 19, 2022

Related U.S. Application Data

(62) Division of application No. 16/548,483, filed on Aug. 22, 2019, now Pat. No. 11,245,029.

(51) Int. Cl.
*H01L 29/66* (2006.01)
*H01L 29/78* (2006.01)

(52) U.S. Cl.
CPC .... *H01L 29/6681* (2013.01); *H01L 29/66545* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee |
| 9,576,814 | B2 | 2/2017 | Wu et al. |

(Continued)

*Primary Examiner* — Khaja Ahmad
(74) *Attorney, Agent, or Firm* — Birch, Stewart, Kolasch & Birch, LLP

(57) ABSTRACT

A structure and formation method of a semiconductor device is provided. The method includes forming a semiconductor stack having first sacrificial layers and first semiconductor layers laid out alternately. The method also includes patterning the semiconductor stack to form a first structure and a second structure. The method further includes replacing the second structure with a third structure having second sacrificial layers and second semiconductor layers laid out alternately. In addition, the method includes removing the first sacrificial layers in the first structure and the second sacrificial layers in the third structure. The method includes forming a first metal gate stack and a second metal gate stack to wrap around each of the first semiconductor layers in the first structure and each of the second semiconductor layers in the third structure, respectively.

20 Claims, 17 Drawing Sheets

(56) References Cited

U.S. PATENT DOCUMENTS

| | | | |
|---|---|---|---|
| 2015/0097220 A1* | 4/2015 | Ponoth | H01L 27/0629 |
| | | | 257/296 |
| 2016/0240652 A1* | 8/2016 | Ching | H01L 21/283 |
| 2017/0104060 A1* | 4/2017 | Balakrishnan | |
| | | | H01L 21/823412 |
| 2017/0140933 A1* | 5/2017 | Lee | H01L 29/1079 |
| 2017/0316980 A1 | 11/2017 | Chang et al. | |
| 2019/0280088 A1* | 9/2019 | Xu | H01L 21/02532 |
| 2020/0006333 A1* | 1/2020 | Noh | H01L 21/3086 |
| 2020/0098756 A1* | 3/2020 | Lilak | B82Y 10/00 |
| 2020/0105872 A1* | 4/2020 | Glass | H01L 29/66795 |

* cited by examiner

_SEMICONDUCTOR DEVICE STRUCTURE WITH METAL GATE STACK_

PRIORITY CLAIM AND CROSS-REFERENCE

This Application is a Divisional of U.S. application Ser. No. 16/548,483, filed on Aug. 22, 2019, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
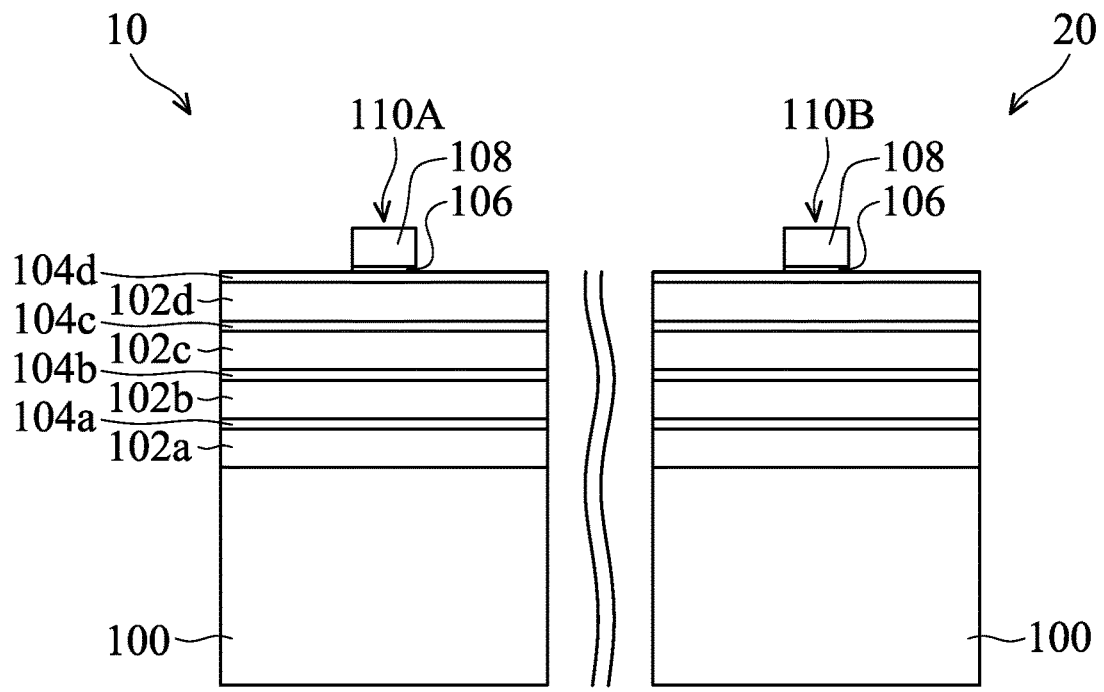
FIGS. 1A-1N are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned by any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
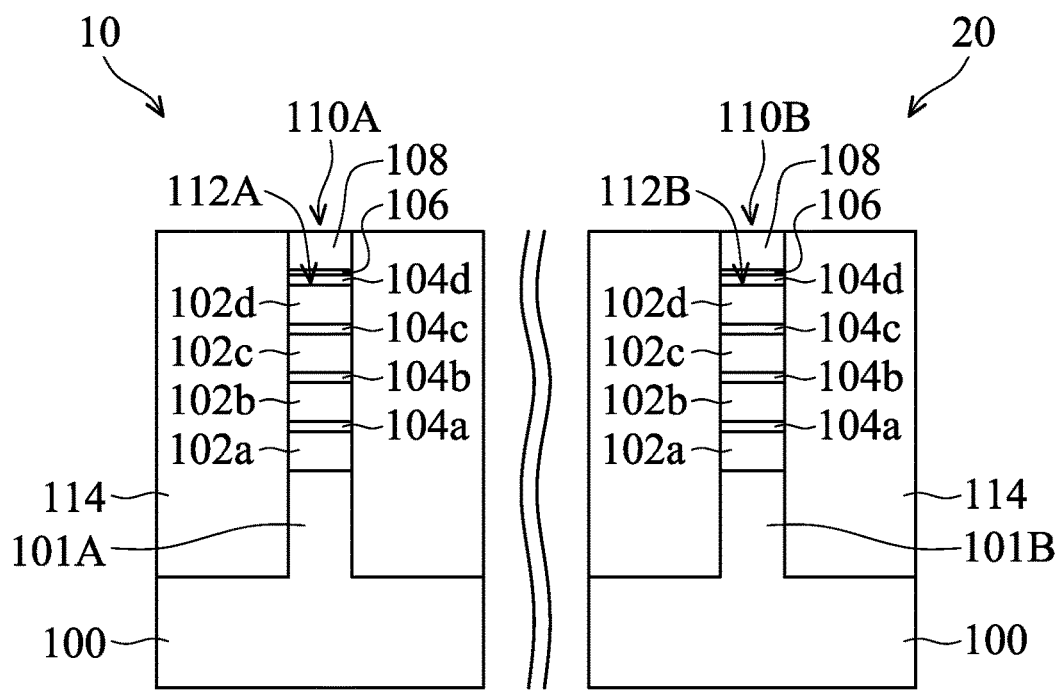
Figure 1C:
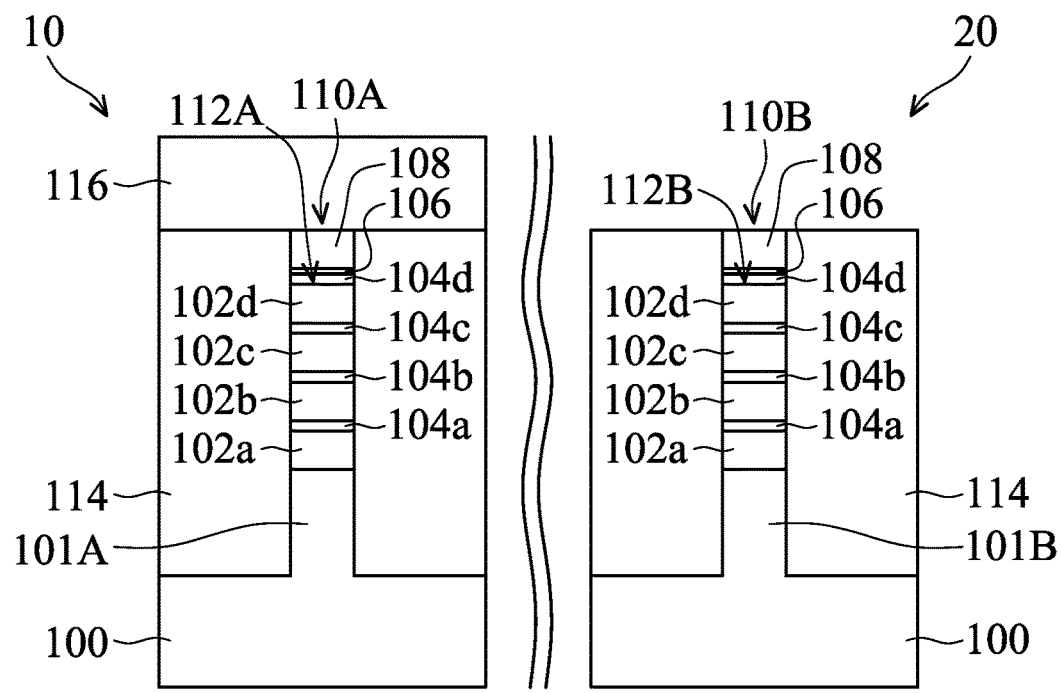
Figure 1D:
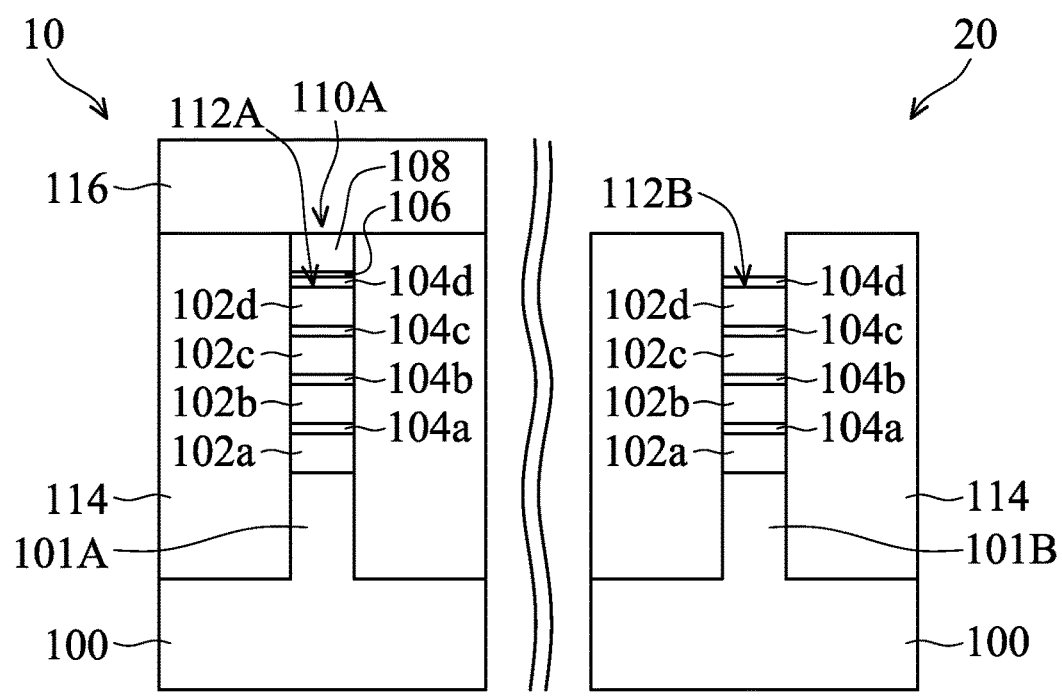
Figure 1E:
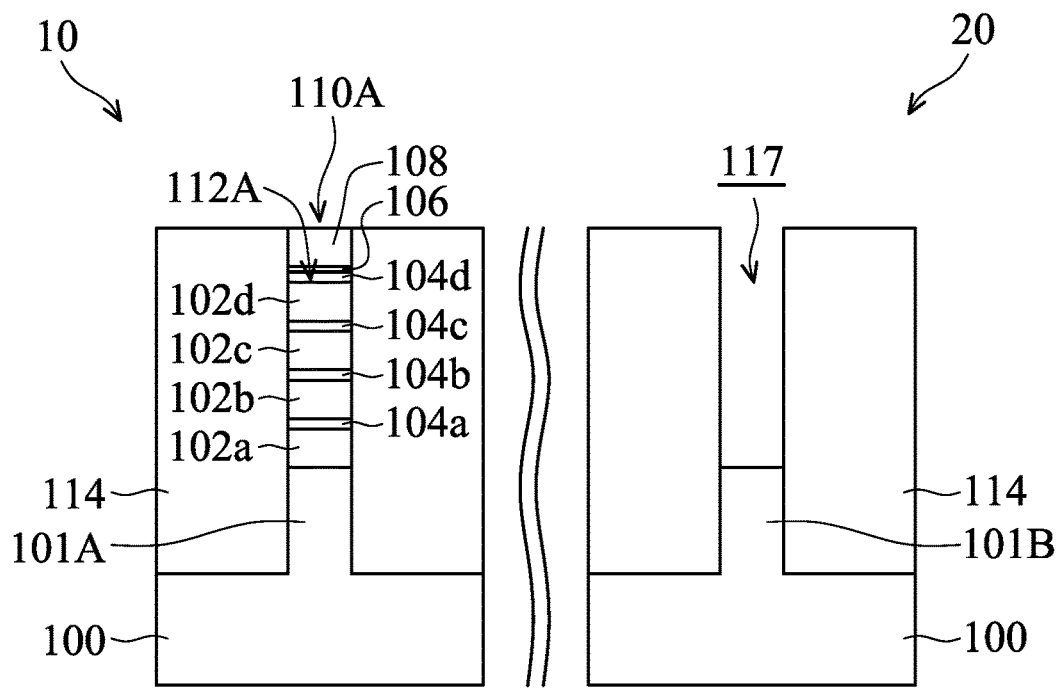
Figure 1F:
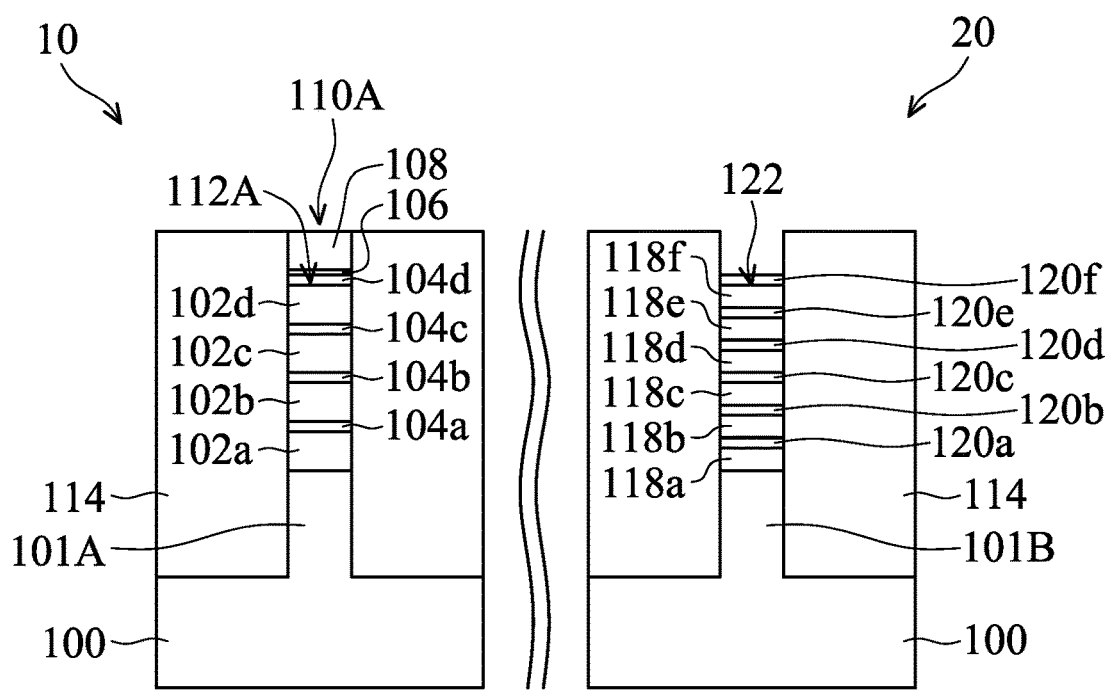
Figure 1G:
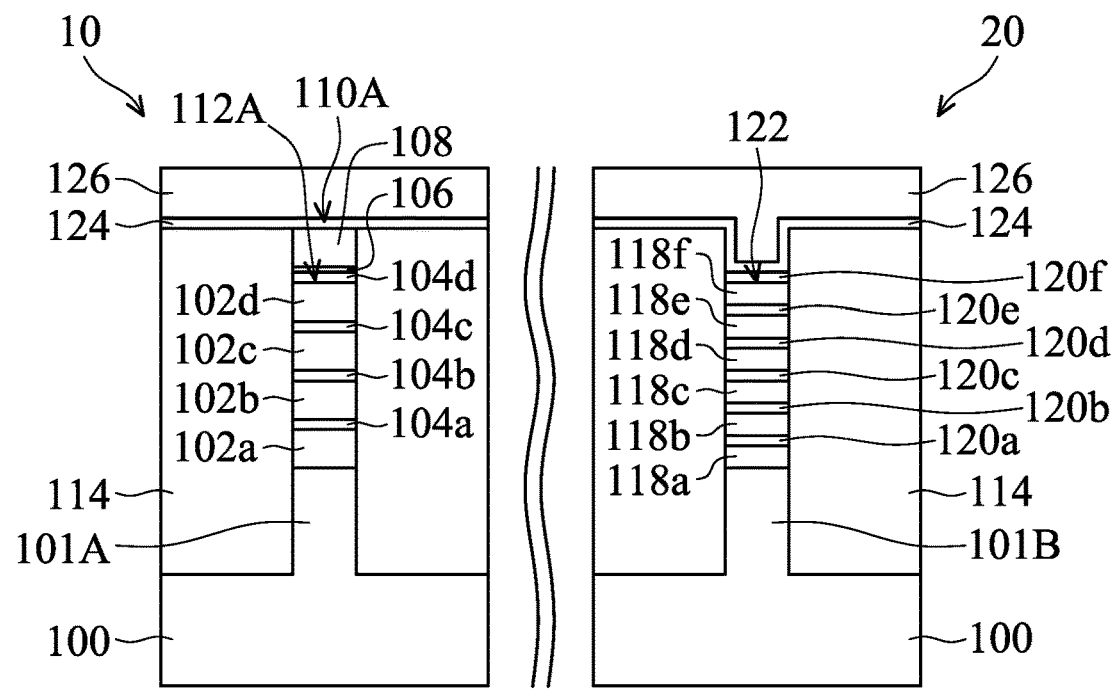
Figure 1H:
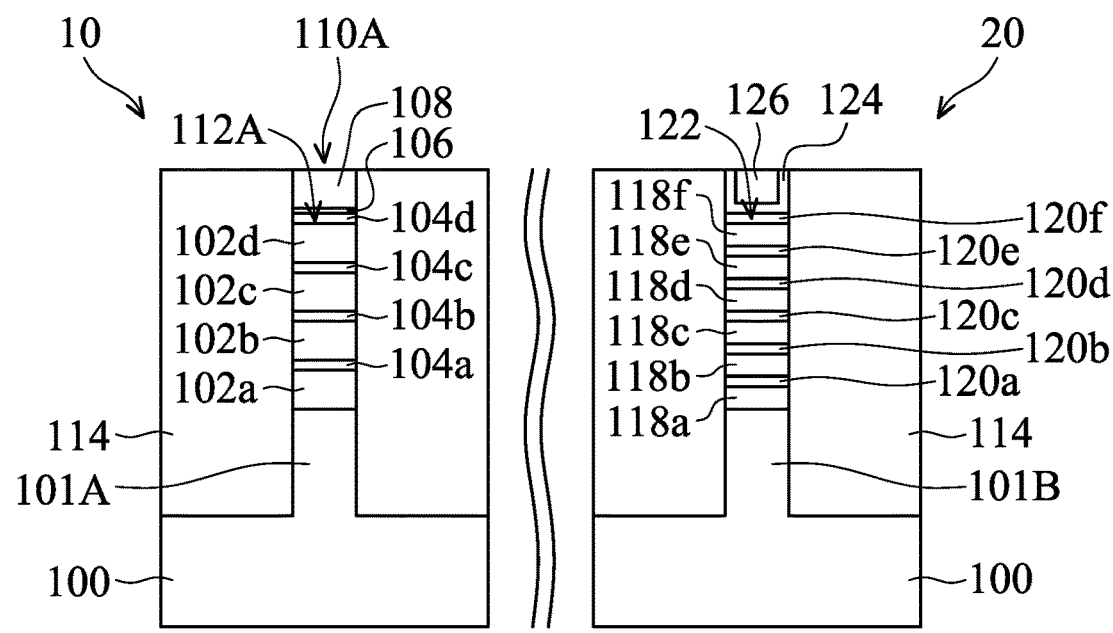
Figure 1I:
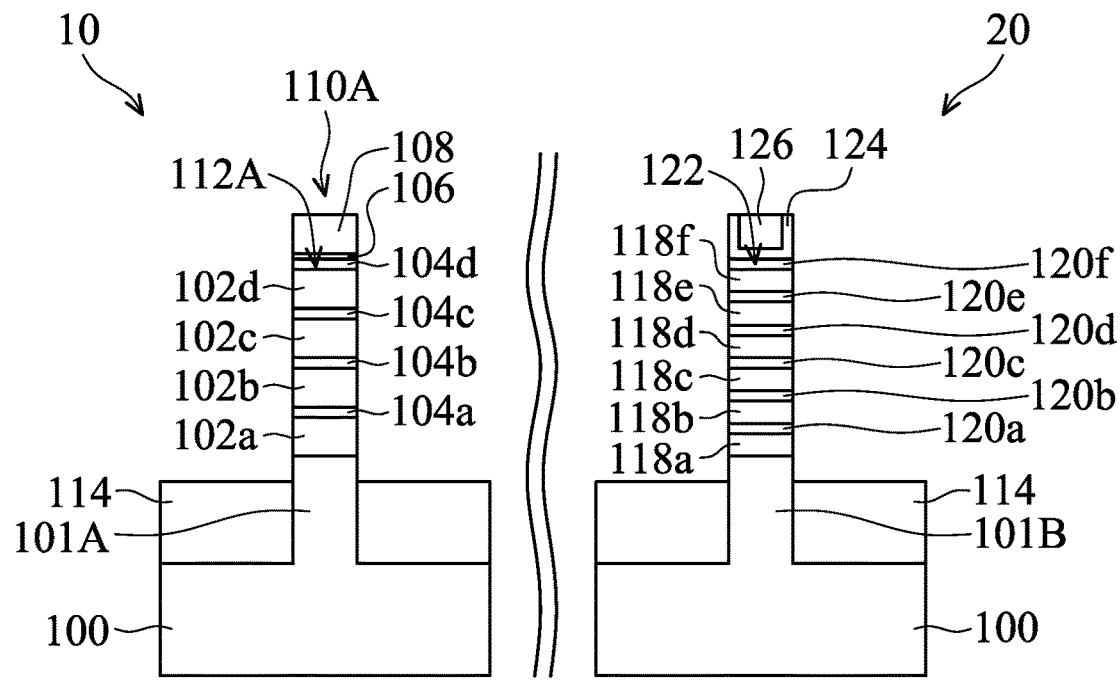
Figure 1J:
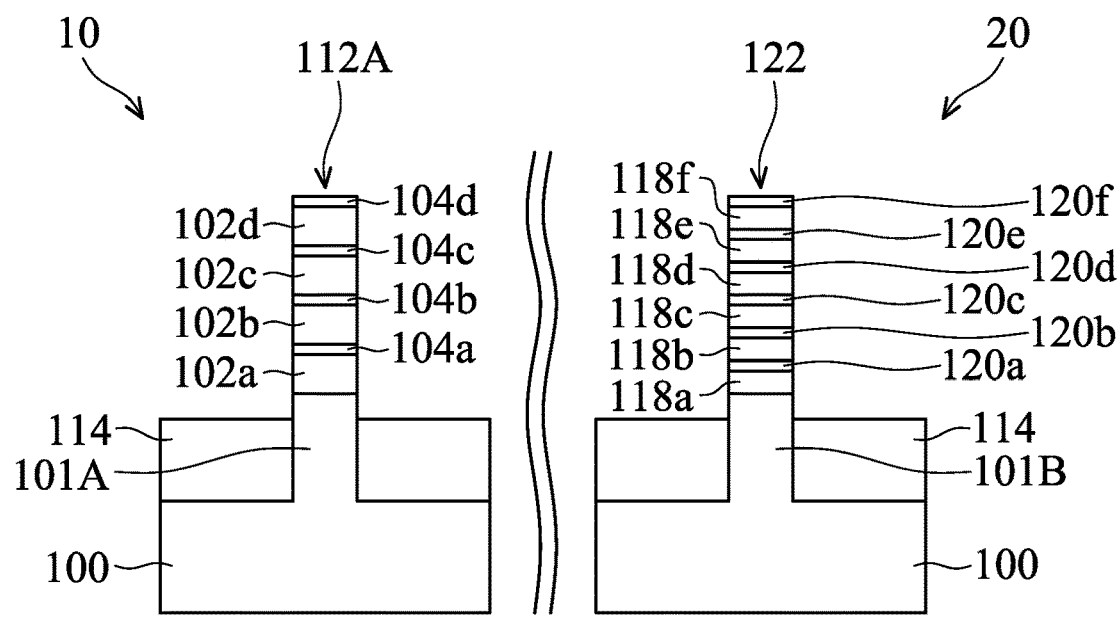
Figure 1K:
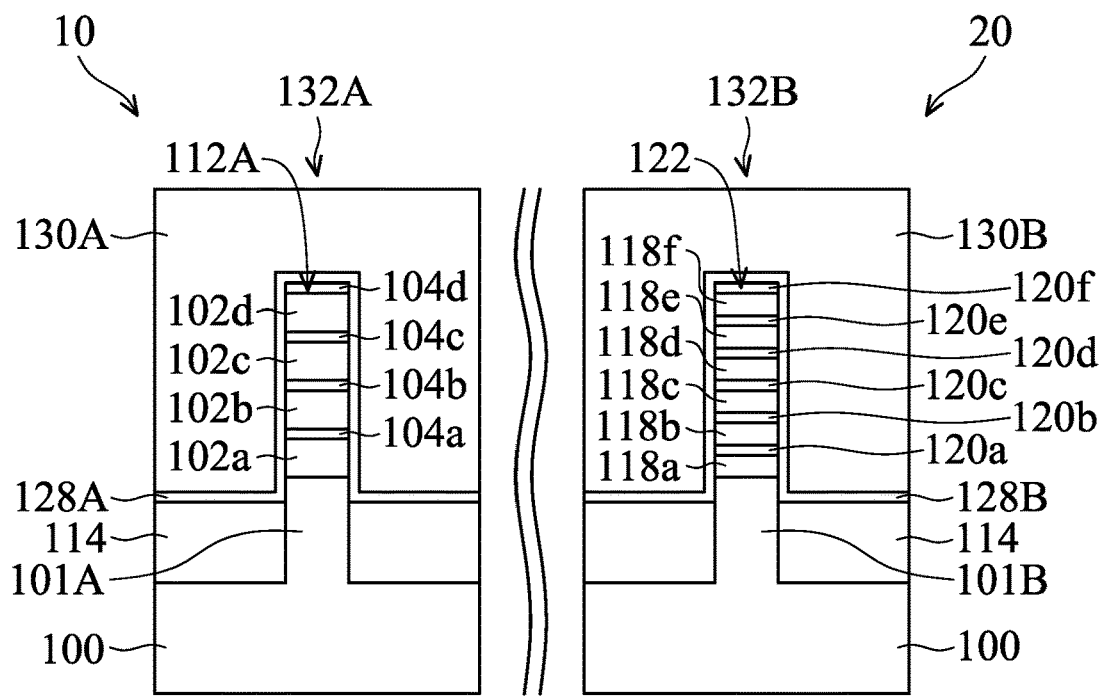
Figure 1L:
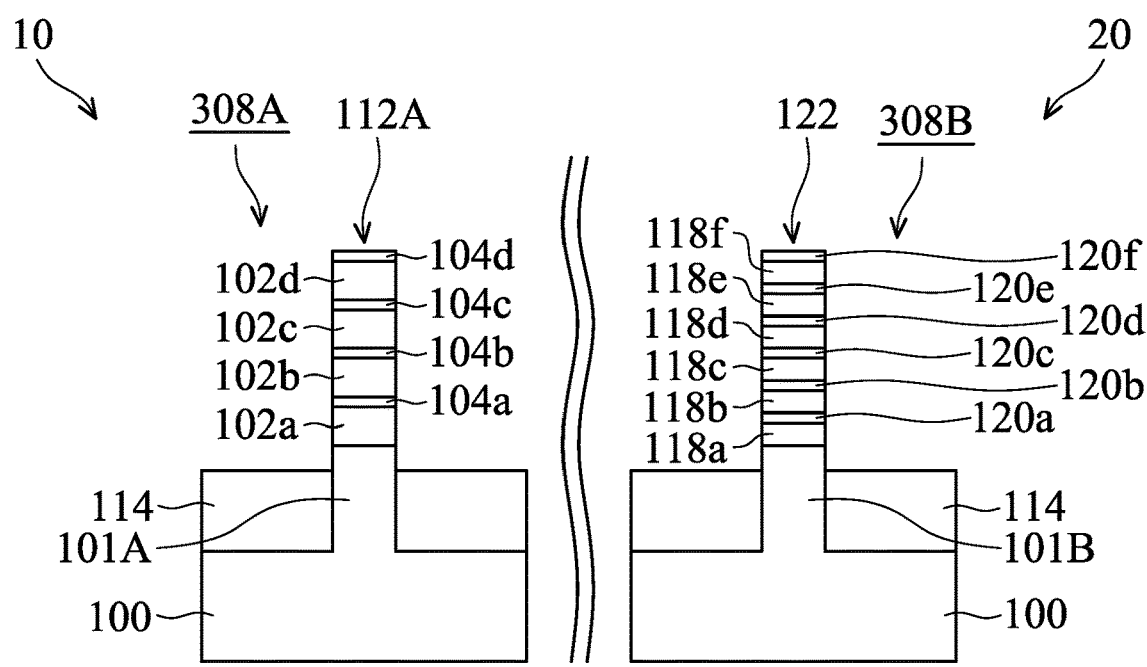
Figure 1M:
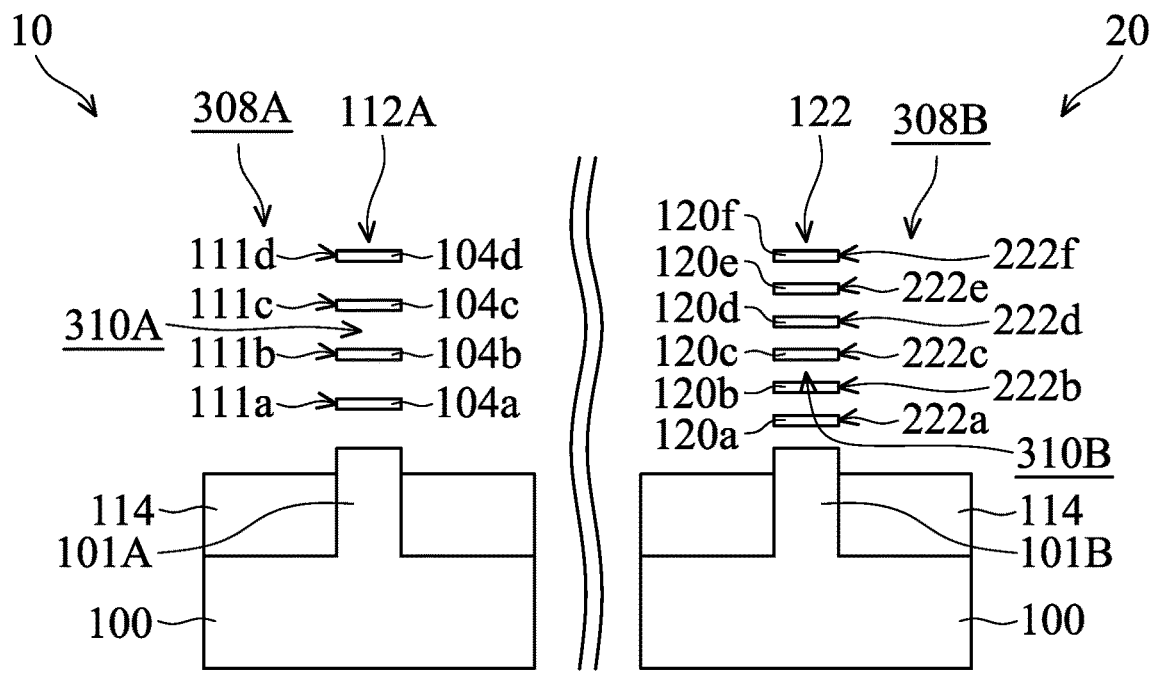
Figure 1N:
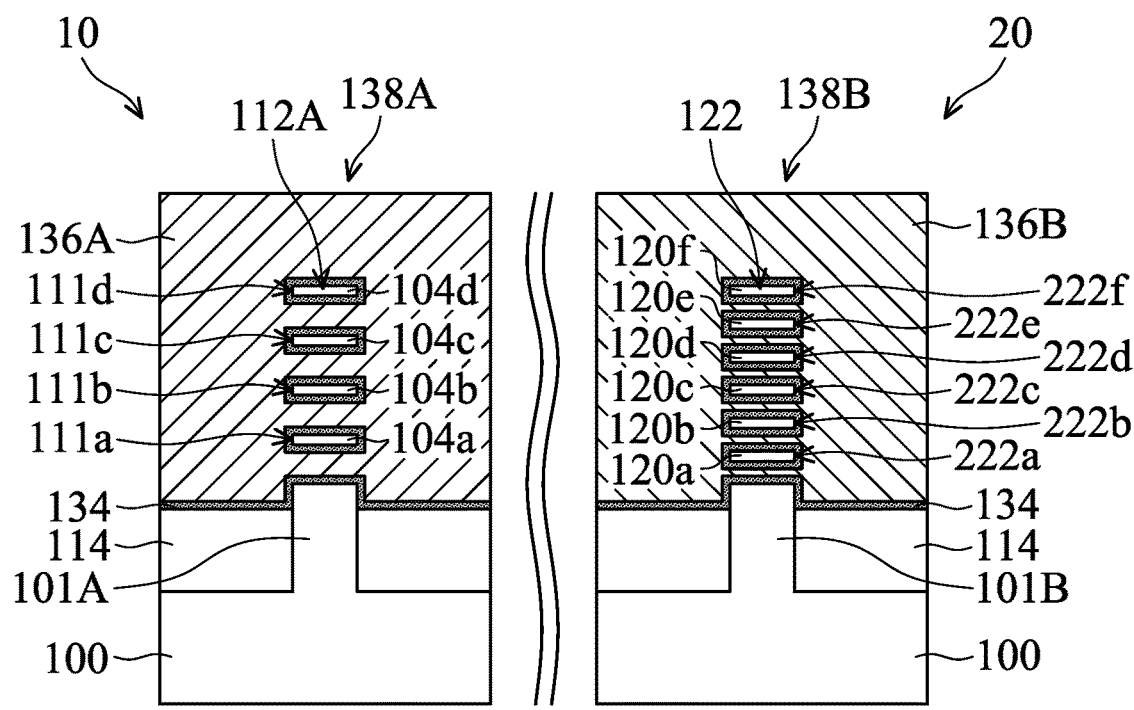

FIGS. 1A-1N are cross-sectional views of various stages of a process for forming a semiconductor device structure, in accordance with some embodiments. As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, the semiconductor substrate 100 includes a first region 10 and a second region 20. In some embodiments, a transistor (such as a FinFET) is to be formed over the first region 10, and a capacitor is to be formed over the second region 20. The transistor and the capacitor may together form a part of an analog device. However, embodiments of the disclosure are not limited thereto. In some other embodiments, different transistors are to be formed over the first region 10 and the second region 20, respectively.

As shown in FIG. 1A, a semiconductor stack having multiple semiconductor layers is formed over the semiconductor substrate 100, in accordance with some embodiments. The semiconductor stack extends over the first region 10 and the second region 20. In some embodiments, the semiconductor stack includes multiple sacrificial layers 102a, 102b, 102c, and 102d, and the semiconductor stack also includes multiple semiconductor layers 104a, 104b, 104c, and 104d. In some embodiments, the sacrificial layers 102a-102d and the semiconductor layers 104a-104d are laid out alternately, as shown in FIG. 1A.

In some embodiments, the sacrificial layers 102a-102d and the semiconductor layers 104a-104d are made of different materials. In some embodiments, the sacrificial layers 102a-102d are made of or include silicon germanium or germanium, and the semiconductor layers 104a-104d are made of or include silicon.

In some embodiments, each of the semiconductor layers 104a-104d is thinner than each of the sacrificial layers 102a-102d. Having the sacrificial layer to be thicker than the semiconductor layer may facilitate the subsequent processes, such as a subsequent metal gate filling process. However, many variations and/or modifications can be made to embodiments of the disclosure. In some other embodiments, each of the semiconductor layers 104a-104d is substantially as thick as each of the sacrificial layers 102a-102d. In some other embodiments, each of the semiconductor layers 104a-104d is thicker than each of the sacrificial layers 102a-102d.

In some embodiments, the sacrificial layers 102a-102d and the semiconductor layers 104a-104d are formed using an epitaxial growth operation. Each of the sacrificial layers 102a-102d and the semiconductor layers 104a-104d may be formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof. In some embodiments, the sacrificial layers 102a-102d and the semiconductor layers 104a-104d are grown in-situ in the same process chamber. In some embodiments, the growth of the sacrificial layer and the growth of the semiconductor layer are alternately and sequentially performed in the same process chamber to complete the formation the semiconductor stack.

Afterwards, hard mask elements 110A and 110B are formed over the semiconductor stack, as shown in FIG. 1A in accordance with some embodiments. The hard mask elements 110A and 110B are used to assist in the subsequent patterning of the semiconductor stack. In some embodiments, the hard mask elements 110A and 110B includes multiple sub-layers such as hard mask layers 106 and 108. In some embodiments, the hard mask layer 106 is made of or includes silicon oxide. In some embodiments, the hard mask layer 108 is made of or includes silicon nitride, silicon carbide, silicon oxynitride, titanium nitride, titanium, one or more other suitable materials, or a combination thereof. In some embodiments, the hard mask elements 110A and 110B are deposited using a CVD process, a physical vapor deposition (PVD) process, a spin coating process, one or more other applicable processes, or a combination thereof. One or more patterning processes may be used to have the hard mask elements 110A and 110B with the desired patterns.

As shown in FIG. 1B, the semiconductor stack is patterned to respectively form fin structures 112A and 112B over the first region 10 and the second region, in accordance with some embodiments. In some embodiments, one or more etching processes are used to partially remove the semiconductor stack. As a result, the remaining portions of the semiconductor stack form the fin structures 112A and 112B, as shown in FIG. 1B. In some embodiments, the semiconductor substrate 100 is also partially removed. As a result, protruding structures 101A and 101B are also formed as portions of the fin structures 112A and 112B, as shown in FIG. 1B.

As shown in FIG. 1B, an isolation structure 114 is formed to surround the fin structures 112A and 112B, in accordance with some embodiments. The isolation structure 114 may also surround the hard mask elements 110A and 110B. In some embodiments, the top surface of the isolation structure 114 is substantially level with the top surfaces of the hard mask elements 110A and 110B.

In some embodiments, one or more dielectric layers are deposited over the fin structures 112A and 112B and the semiconductor substrate 100. Afterwards, a planarization process is used to partially remove the dielectric layers. The hard mask elements 110A and 110B may also function as a stop layer of the planarization process. As a result, the remaining portion of the dielectric layers forms the isolation structure 114. The planarization process may include a chemical mechanical polishing (CMP) process, a grinding process, a dry polishing process, an etching process, one or more other applicable processes, or a combination thereof.

As shown in FIG. 1C, a mask element 116 is formed to cover the fin structure 112A and a portion of the isolation structures 114, in accordance with some embodiments. Meanwhile, the hard mask element 110B over the fin structure 112B and a portion of the isolation structure 114 surrounding the fin structure 112B are exposed without being covered by the mask element 116. In some embodiments, the mask element 116 is a patterned photoresist element. In some embodiments, an anti-reflection coating (not shown) is formed under the mask element 116 to assist in the formation of the mask element 116 with the desired pattern.

As shown in FIG. 1D, the hard mask element 110B is removed to expose the top surface of the fin structure 112B, in accordance with some embodiments. For example, the semiconductor layer 104d is exposed, as shown in FIG. 1D. In some embodiments, the hard mask element 110B is removed using one or more etching processes. Due to the protection of the mask element 116, the hard mask element 110A is not etched.

As shown in FIG. 1E, the fin structure 112B is removed, in accordance with some embodiments. As a result, a recess 117 where the fin structure 112B is originally occupied is formed, as shown in FIG. 1E. The recess 117 is surrounded by the isolation structure 114. In some embodiments, one or more etching processes are used to remove the fin structure 112B. In some embodiments, the fin structure 112B is removed using different etching gases in the same process chamber. Different etching gases may be introduced into the process chamber alternately and sequentially to remove the semiconductor layers and the sacrificial layers. In some other embodiments, the same mixture of etching gases is introduced in the process chamber to remove the fin structure 112B in a single etching operation.

As shown in FIG. 1F, sacrificial layers 118a-118f and semiconductor layers 120a-120f are sequentially and alternately formed in the recess 117 to form a fin structure 122, in accordance with some embodiments. As illustrated in FIGS. 1D-1F, the fin structure 112B is replaced with the fin structure 122, in accordance with some embodiments.

In some embodiments, the sacrificial layers 118a-118f of the fin structure 122 and the sacrificial layers 102a-102d of the fin structure 112A are made of the same material. For example, the sacrificial layers 118a-118f and 102a-102d are made of silicon germanium or germanium. In some embodiments, the semiconductor layers 120a-120f of the fin structure 122 and the semiconductor layers 104a-104d are made of the same material. For example, the semiconductor layers 120a-120f and 104a-104d are made of silicon.

However, embodiments of the disclosure are not limited thereto. Many variations and/or modifications can be made to embodiments of the disclosure. In some other embodiments, the material of semiconductor layers 120a-120f of the fin structure 122 is different than the material of the semiconductor layers 104a-104d of the fin structure 112A.

In some embodiments, the semiconductor layers 120a-120f include dopants dispersed therein. In some embodiments, each of the semiconductor layers 120a-120f of the fin structure 122 has a greater dopant concentration than that of each of the semiconductor layers 104a-104d of the fin structure 112A. In some embodiments, the conductivity of each of the semiconductor layers 120a-120f is greater than each of the semiconductor layers 104a-104d.

In some embodiments, each of the sacrificial layers 118a-118f is thinner than each of the sacrificial layers 102a-102d, as shown in FIG. 1F. In some embodiments, each of the sacrificial layers 118a-118f is thicker than each of the semiconductor layers 120a-120f. In some embodiments, each of the semiconductor layers 120a-120f is substantially as thick as each of the semiconductor layers 104a-104d. However, many variations and/or modifications can be made to embodiments of the disclosure. In some other embodiments, each of the semiconductor layers 120a-120f is thinner than each of the semiconductor layers 104a-104d.

In some embodiments, the total number of the semiconductor layers 120a-120f of the fin structure 122 is higher than the total number of the semiconductor layers 104a-104d of the fin structure 112A. As shown in FIG. 1F, the total number of the semiconductor layers 120a-120f of the fin structure 122 is six that is higher than the total number (i.e., four) of the semiconductor layers 104a-104d of the fin structure 112A.

In some embodiments, the total number of the sacrificial layers 118a-118f of the fin structure 122 is higher than the total number of the sacrificial layers 102a-102d of the fin structure 112A. As shown in FIG. 1F, the total number of the sacrificial layers 118a-118f of the fin structure 122 is six that is higher than the total number (i.e., four) of the sacrificial layers 102a-102d of the fin structure 112A.

As shown in FIG. 1F, there is interface between the sacrificial layer and the semiconductor layer that are next to each other. For example, there is an interface between the sacrificial layer 118a and the semiconductor layer 120a. Similarly, there is an interface between the sacrificial layer 118b and the semiconductor layer 120b. In some embodiments, the total (i.e., the entire combination of) interface area between the sacrificial layers 118a-118f and the semiconductor layers 120a-120f in the fin structure 122 is larger than the total interface area between the sacrificial layers 102a-102d and the semiconductor layers 104a-104d in the fin structure 112A.

As shown in FIG. 1G, hard mask layers 124 and 126 are sequentially deposited over the structure shown in FIG. 1F, in accordance with some embodiments. The hard mask layer 124 may extend along upper sidewalls of the isolation structure 114, as shown in FIG. 1G. The material and formation method of the hard mask layer 124 may be the same as or similar to those of the hard mask layer 106. The material and formation method of the hard mask layer 126 may be the same as or similar to those of the hard mask layer 108.

As shown in FIG. 1H, a planarization process is use to remove the portion of the hard mask layers 124 and 126 above the top surface of the isolation structure 114, in accordance with some embodiments. As a result, the hard mask element 110A and the isolation structure 114 are exposed. The fin structure 122 is covered by the remaining portions of the hard mask layers 124 and 126. The planarization process may include a CMP process, a grinding process, a dry polishing process, an etching process, one or more other applicable processes, or a combination thereof.

As shown in FIG. 1I, the isolation structure 114 is partially removed, in accordance with some embodiments. As a result, the fin structures 112A and 122 protrude from the top surface of the remaining isolation structure 114. One or more etching processes may be used to recess the isolation structure 114. Afterwards, the hard mask layers 106, 108, 124, and 126 are removed, as shown in FIG. 1J in accordance with some embodiments.

Figure 2:
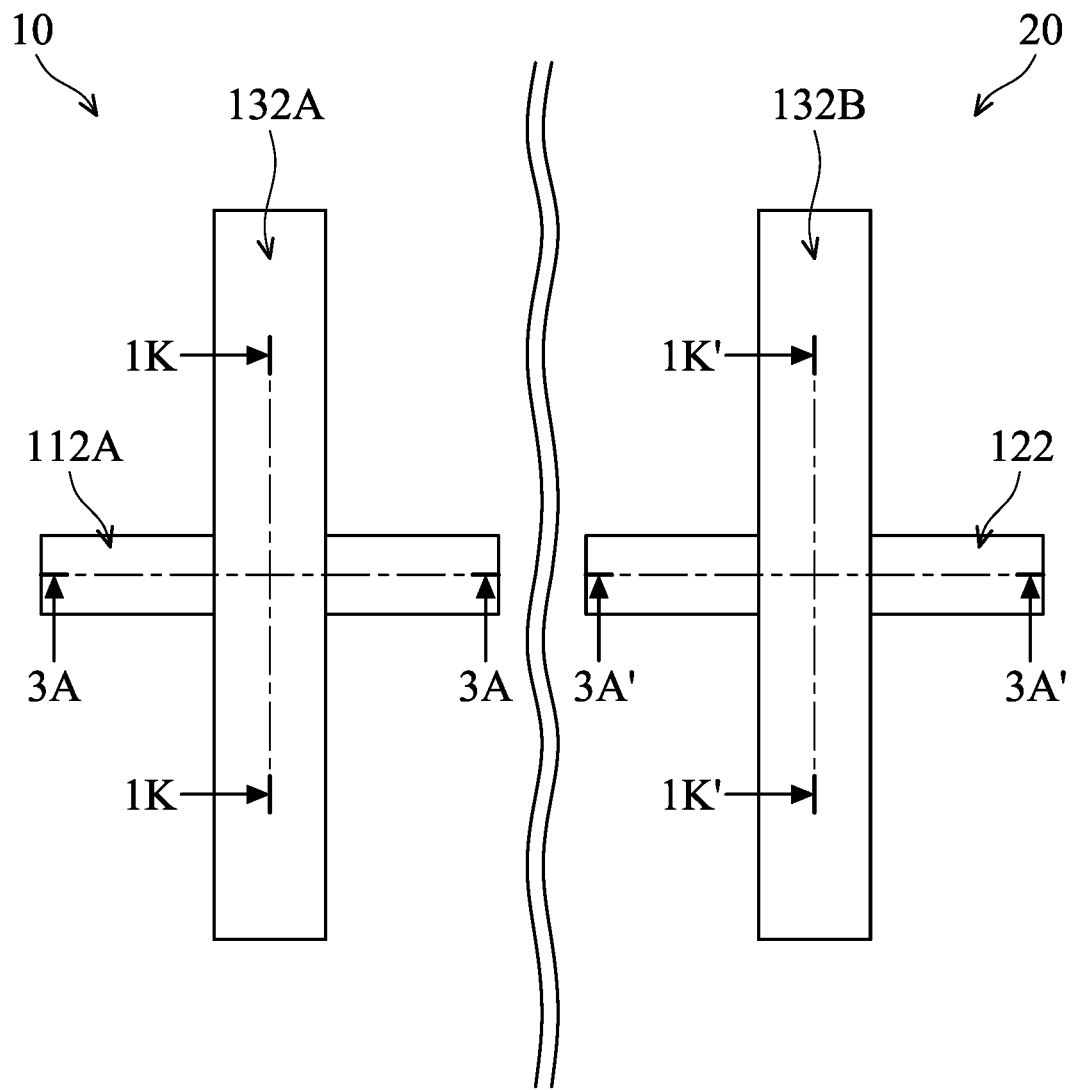
FIG. 2 is a top layout view of an intermediate stage of a process for forming a semiconductor device structure, in accordance with some embodiments.
Figure 3A:
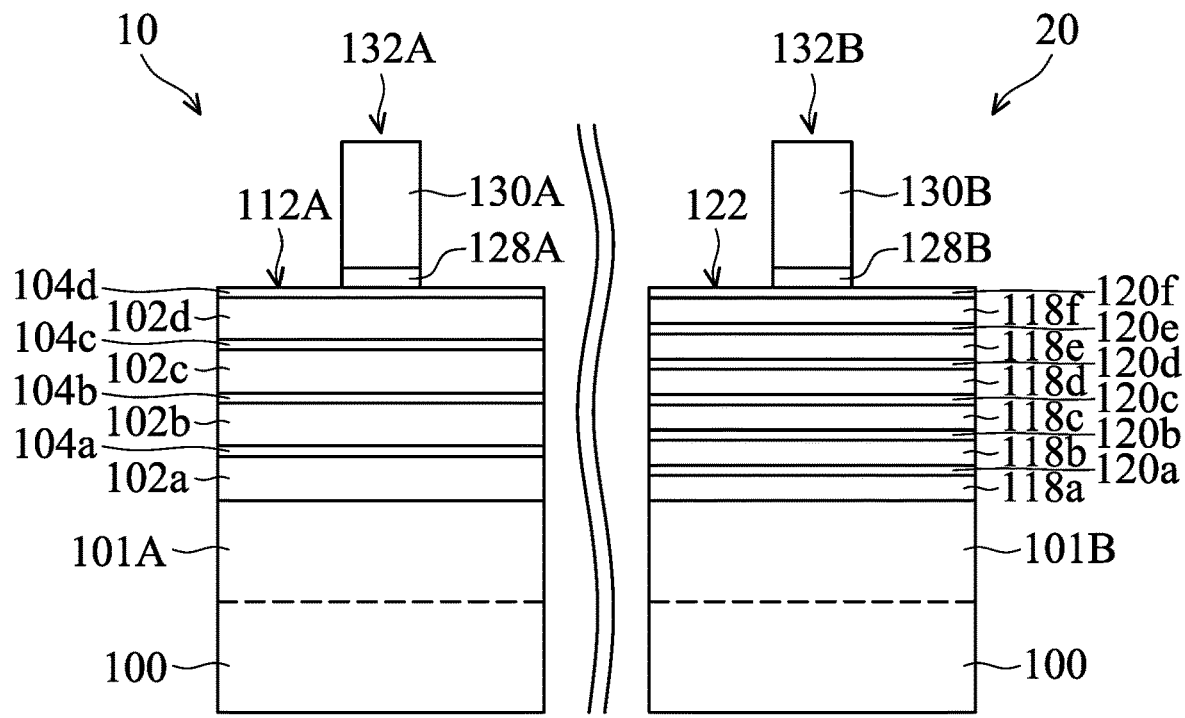
FIGS. 3A-3J are cross-sectional views of various stages of a process for forming a semiconductor device structure, in accordance with some embodiments.

Afterwards, dummy gate stacks 132A and 132B are formed, in accordance with some embodiments. FIG. 2 is a top layout view of an intermediate stage of a process for forming a semiconductor device structure, in accordance with some embodiments. FIGS. 3A-3J are cross-sectional views of various stages of a process for forming a semiconductor device structure, in accordance with some embodiments. In some embodiments, FIG. 1K shows the cross-sectional view of the semiconductor device structure taken along the lines 1K-1K and 1K'-1K' in FIG. 2. In some embodiments, FIG. 3A shows the cross-sectional view of the semiconductor device structure taken along the lines 3A-3A and 3A'-3A' in FIG. 2.

As shown in FIGS. 1K, 2A, and 3A, dummy gate stacks 132A and 132B are formed to partially cover and to extend across the fin structures 112A and 122, in accordance with some embodiments. In some embodiments, the dummy gate stacks 132A and 132B wraps around the fin structures 112A and 122, as shown in FIG. 1K. The dummy gate stack 132A includes a dummy gate dielectric layer 128A and a dummy gate electrode 130A, as shown in FIGS. 1K and 3A. The dummy gate stack 132B includes a dummy gate dielectric layer 128B and a dummy gate electrode 130B.

The dummy gate dielectric layers 128A and 128B may be made of or include silicon oxide. The dummy gate electrodes 130A and 130B may be made of or include polysilicon. In some embodiments, a dummy gate dielectric material layer and a dummy gate electrode layer are sequentially deposited over the isolation structure 114 and the fin structures 112A and 122. Afterwards, the dummy gate dielectric material layer and the dummy gate electrode layer are patterned to form the dummy gate stacks 132A and 132B.

In some embodiments, the dummy gate stacks 132A and 132B are two separate dummy gate stacks. However, embodiments of the disclosure are not limited thereto. Many variations and/or modifications can be made to embodiments of the disclosure. In some other embodiments, the elements 132A and 132B are portions of a single dummy gate stack. In these cases, the device structures formed over the regions 10 and 20 share the same dummy gate stack.

Figure 3B:
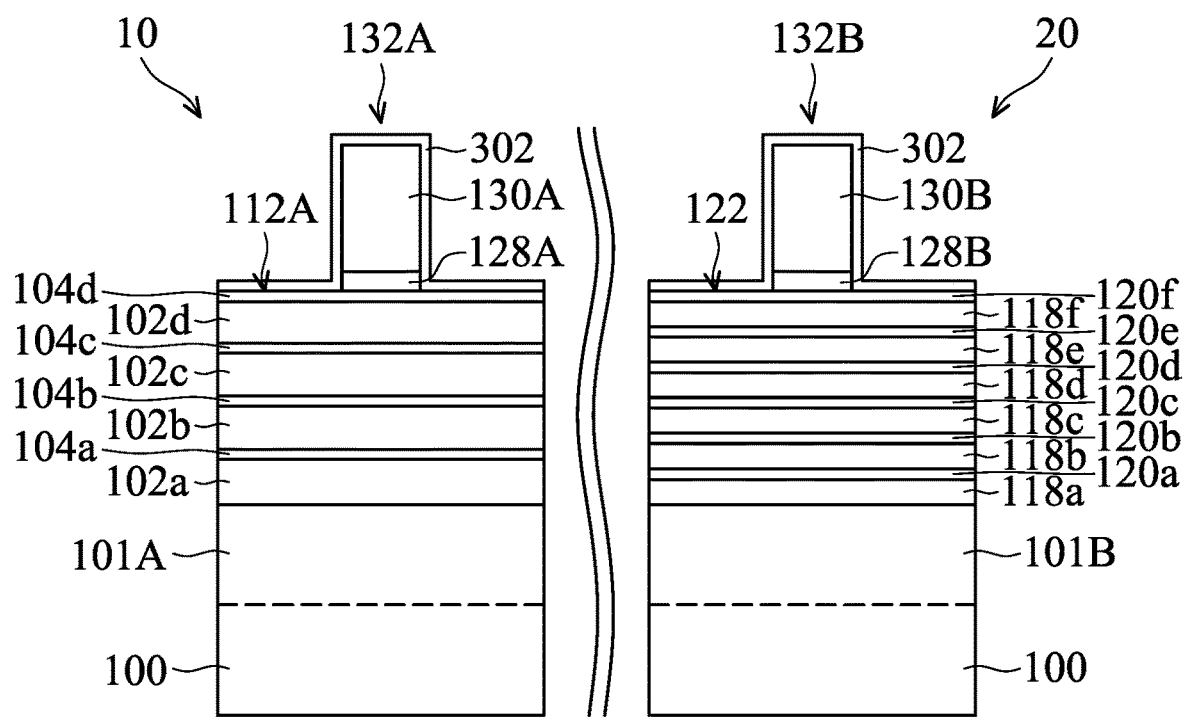

As shown in FIG. 3B, a spacer layer 302 is deposited over the structure shown in FIG. 3A. The spacer layer 302 may extend along the sidewalls of the dummy gate stacks 132A and 132B. The spacer layer 302 may be made of or include silicon nitride, silicon oxynitride, silicon carbide, one or more other suitable materials, or a combination thereof. The spacer layer 302 may be deposited using a CVD process, an atomic layer deposition (ALD) process, a PVD process, one or more other applicable processes, or a combination thereof.

Figure 3C:
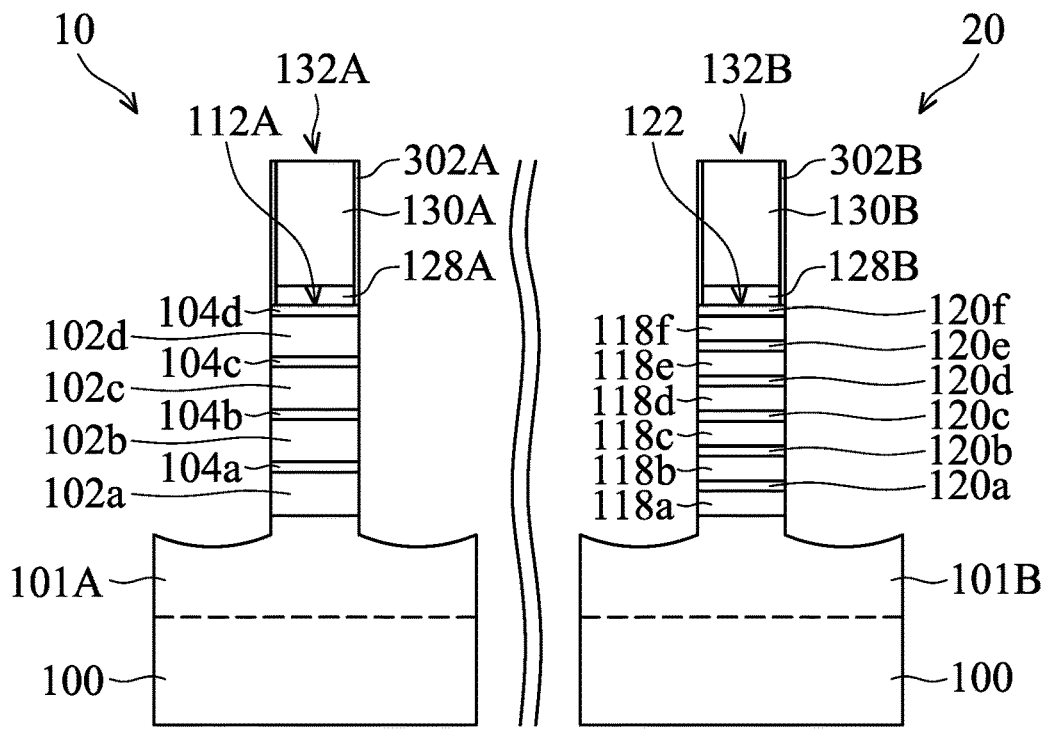

As shown in FIG. 3C, the semiconductor layers 104a-104d and the sacrificial layers 102a-102d that protrude from the sidewalls of the dummy gate stack 132A are removed, in accordance with some embodiments. The semiconductor layers 120a-120f and the sacrificial layers 118a-118f that protrude from the sidewalls of the dummy gate stack 132B are also removed. One or more etching processes may be used to achieve the partial removal of semiconductor layers and sacrificial layers mentioned above. The spacer layer 302 is also partially removed during the one or more etching processes. As a result, remaining portions of the spacer layer 302 extending on the sidewalls of the dummy gate stack 132A form spacer elements 302A. Remaining portions of the spacer layer 302 extending on the sidewalls of the dummy gate stack 132B form spacer elements 302B. The protruding portions 101A and 101B may also be recessed during the one or more etching process, which may facilitate subsequent formation of epitaxial structures.

Figure 3D:
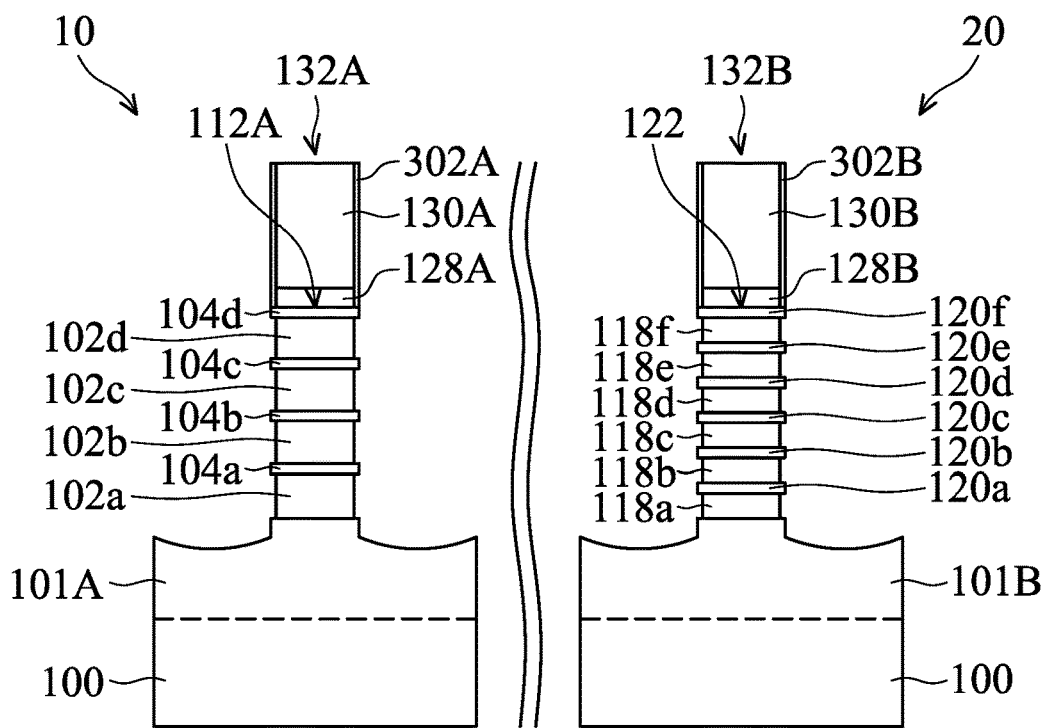
Figure 3E:
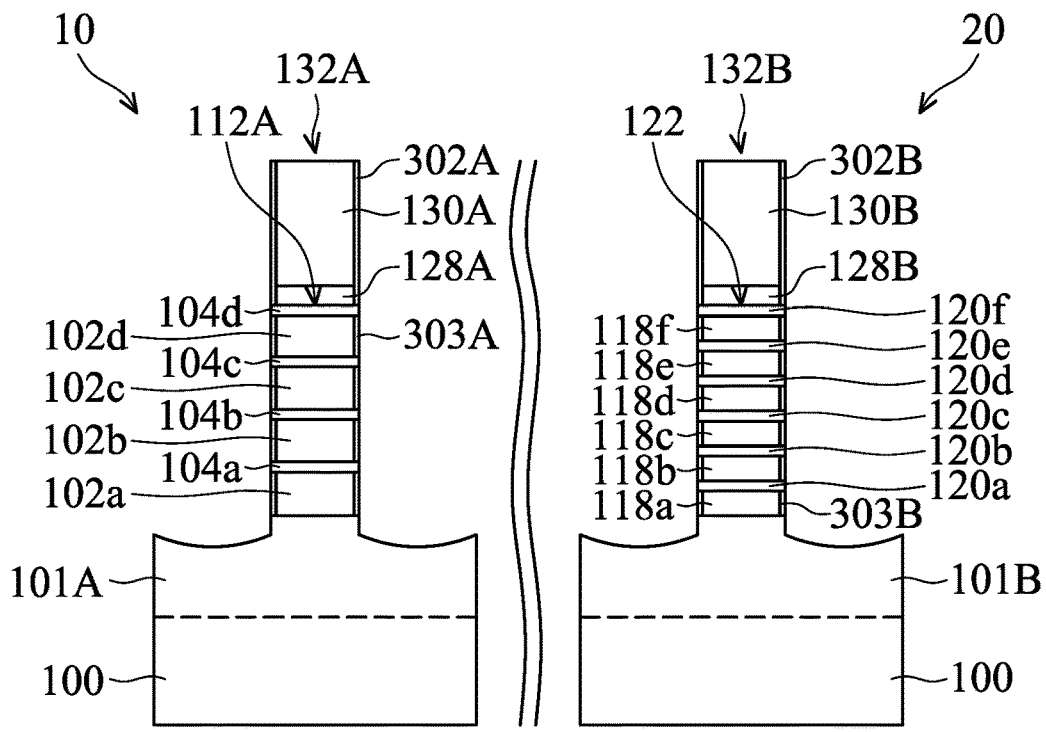

As shown in FIG. 3D, the sacrificial layers 102a-102d and 118a-118f are laterally etched, in accordance with some embodiments. As a result, edges of the sacrificial layers 102a-102d retreat from edges of the semiconductor layers 104a-104d. Edges of the sacrificial layers 118a-118f retreat from edges of the semiconductor layers 120a-120f.

Afterwards, another spacer layer is deposited over the structure shown in FIG. 3D, in accordance with some embodiments. Then, an anisotropic etching process is used to partially remove the spacer layer. The remaining portions of the spacer layer form inner spacers 303A and 303B. The inner spacers 303A and 303B cover the edges of the sacrificial layers 102a-102d and the sacrificial layers 118a-118f, respectively.

Figure 3F:
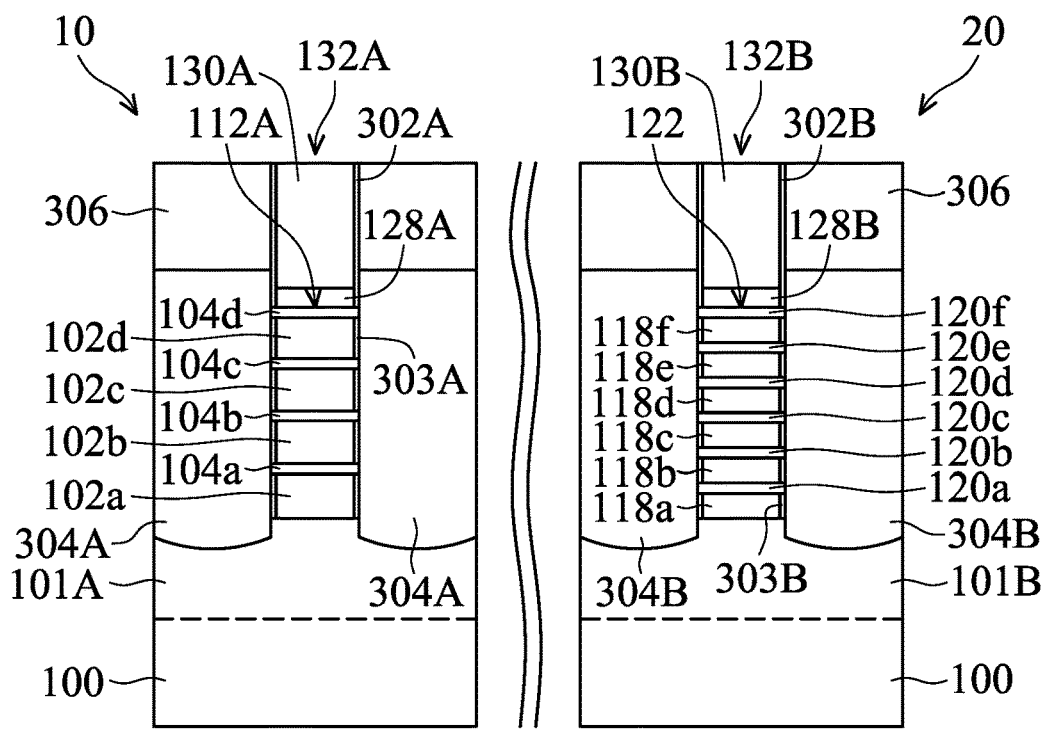

As shown in FIG. 3F, epitaxial structures 304A and 304B are respectively formed beside the dummy gate stacks 132A and 132B, in accordance with some embodiments. In some embodiments, the epitaxial structures 304A connect to the semiconductor layers 104a-104d. The semiconductor layers 104a-104d are sandwiched between the epitaxial structures 304A. In some embodiments, the epitaxial structures 304B connect to the semiconductor layers 120a-120f. The semiconductor layers 120a-120f are sandwiched between the epitaxial structures 304B.

In some embodiments, the epitaxial structures 304A and 304B are p-type regions. For example, the epitaxial structures 304A and 304B may include epitaxially grown silicon germanium or silicon germanium doped with boron. In some other embodiments, the epitaxial structures 304A and 304B are n-type regions. The epitaxial structures 304A and 304B may include epitaxially grown silicon, epitaxially grown silicon carbide (SiC), epitaxially grown silicon phosphide (SiP), or another suitable epitaxially grown semiconductor material.

In some embodiments, the epitaxial structures 304A and 304B are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the epitaxial structures 304A and 304B are doped with one or more suitable dopants. For example, the epitaxial structures 304A and 304B are SiGe source/drain features doped with boron (B), indium (In), or another suitable dopant. Alternatively, in some other embodiments, the epitaxial structures 304A and 304B are Si source/drain features doped with phosphor (P), antimony (Sb), or another suitable dopant.

In some embodiments, the epitaxial structures 304A and 304B are doped in-situ during their epitaxial growth. In some other embodiments, the epitaxial structures 304A and 304B are not doped during the growth of the epitaxial structures 304A and 304B. Instead, after the formation of the epitaxial structures 304A and 304B, the epitaxial structures 304A and 304B are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 304A and 304B are further exposed to one or more annealing processes to activate the dopants. For example, a rapid thermal annealing process is used.

Afterwards, a dielectric layer 306 is deposited over the dummy gate stacks 132A and 132B and the epitaxial structures 304A and 304B, as shown in FIG. 3F in accordance with some embodiments. A planarization process may be used to remove the upper portion of the dielectric layer 306 to provide the dielectric layer 306 with a substantially planar top surface. In some embodiments, the top surface of the dielectric layer 306 is substantially level with the top surfaces of the dummy gate stacks 132A and 132B.

The dielectric layer 306 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. In some embodiments, the dielectric layer 306 is deposited using a CVD process, a flowable chemical vapor deposition (FCVD) process, an ALD process, a spin coating process, one or more other applicable processes, or a combination thereof. The planarization process performed to the dielectric layer 306 may include a CMP process, a grinding process, an etching process, a dry polishing process, one or more other applicable processes, or a combination thereof.

Figure 3G:
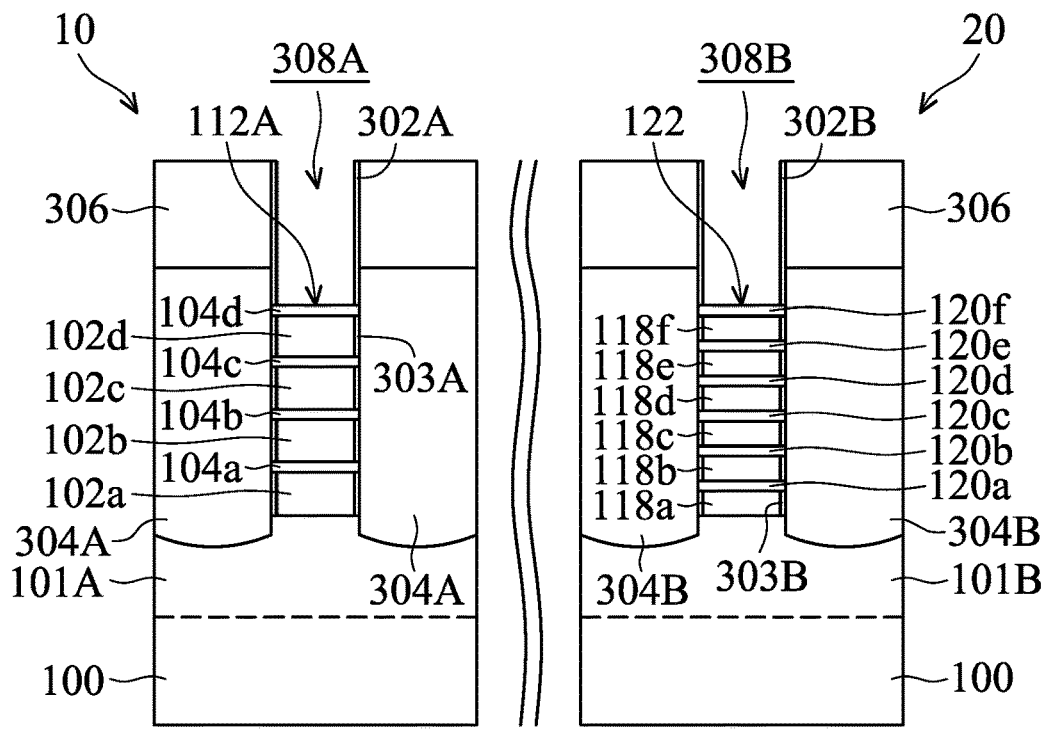

As shown in FIGS. 1L and 3G, one or more etching processes are used to remove the dummy gate stacks 132A and 132B to form trenches 308A and 308B that are surrounded by the dielectric layer 306, in accordance with some embodiments. As shown in FIG. 1L, the trenches 308A and 308B expose the sacrificial layers 102a-102d and 118a-118f, respectively.

Figure 3H:
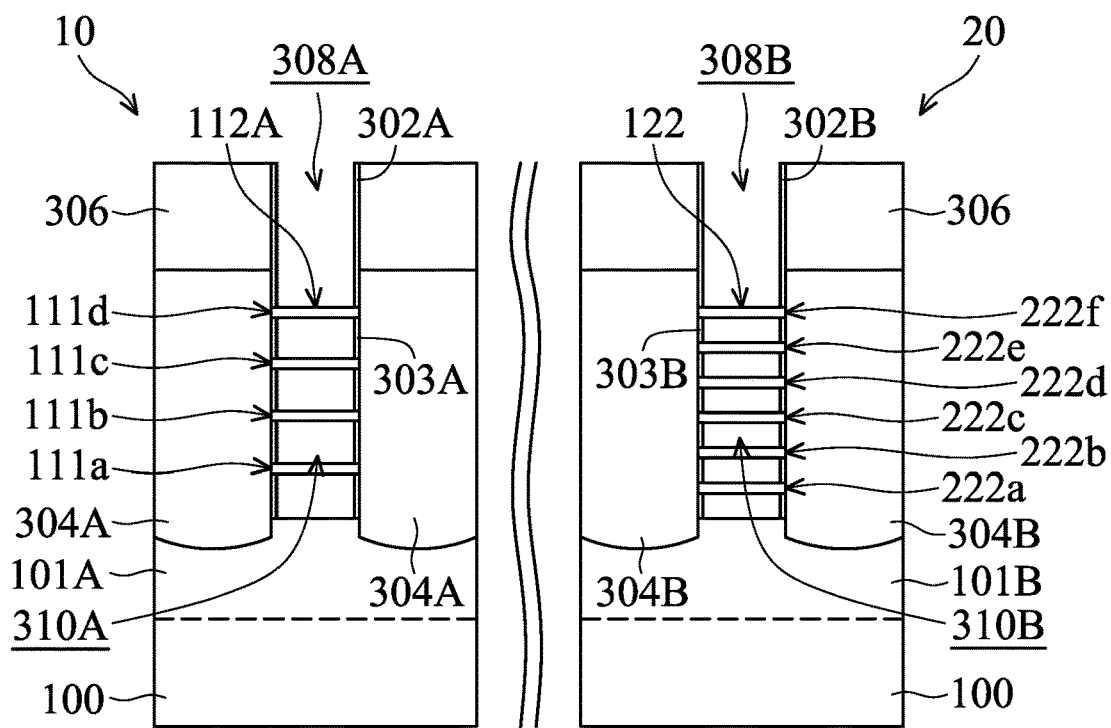

As shown in FIGS. 1M and 3H, the sacrificial layers 102a-102d and 118a-118f are removed, in accordance with some embodiments. In some embodiments, an etching process is used to remove the sacrificial layers 102a-102d and 118a-118f. Due to high etching selectivity, the semiconductor layers 104a-104d and 120a-120f are substantially not etched. The remaining semiconductor layers form semiconductor strips 111a-111d and 222a-222f, as shown in FIGS. 1M and 3H. After the removal of the sacrificial layers 102a-102d and 118a-118f, recesses 310A and 310B are formed. The recesses 310A connect to the trench 308A and surround each of the semiconductor strips 111a-111d. The recesses 310B connect to the trench 308B and surround each of the semiconductor strips 222a-222f. During the removal of the sacrificial layers 102a-102d and 118a-118f, the inner spacers 303A and 303B protect the epitaxial structures 304A and 304B from being etched.

Figure 3I:
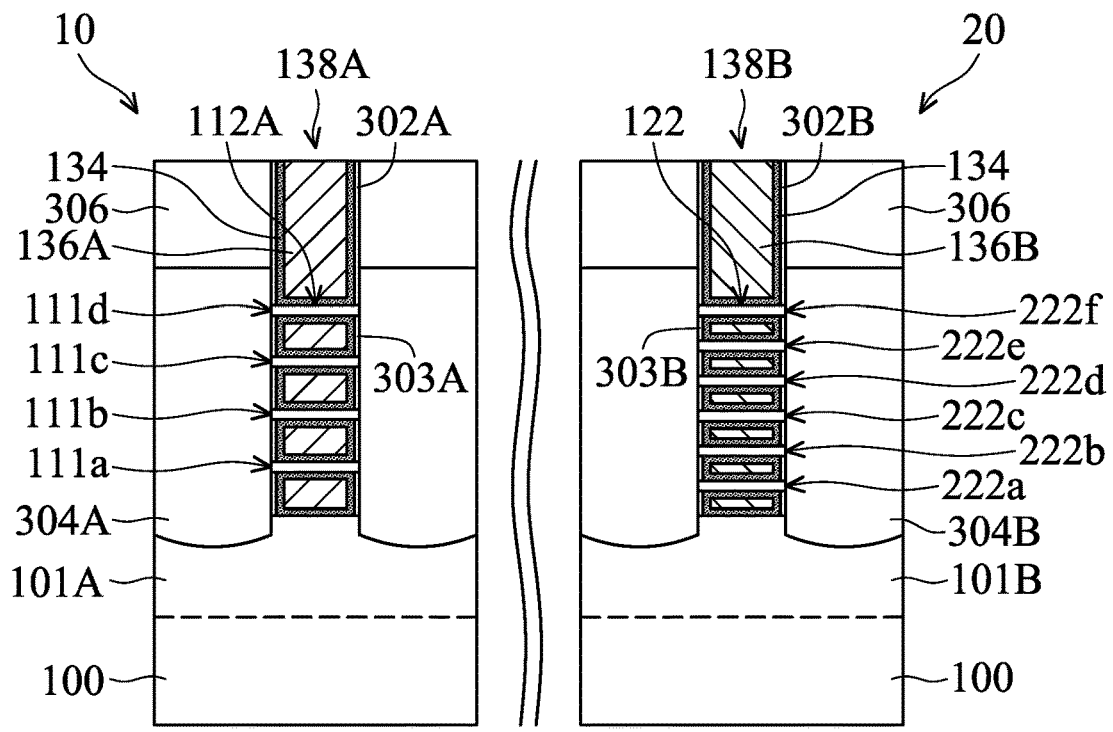
Figure 4:
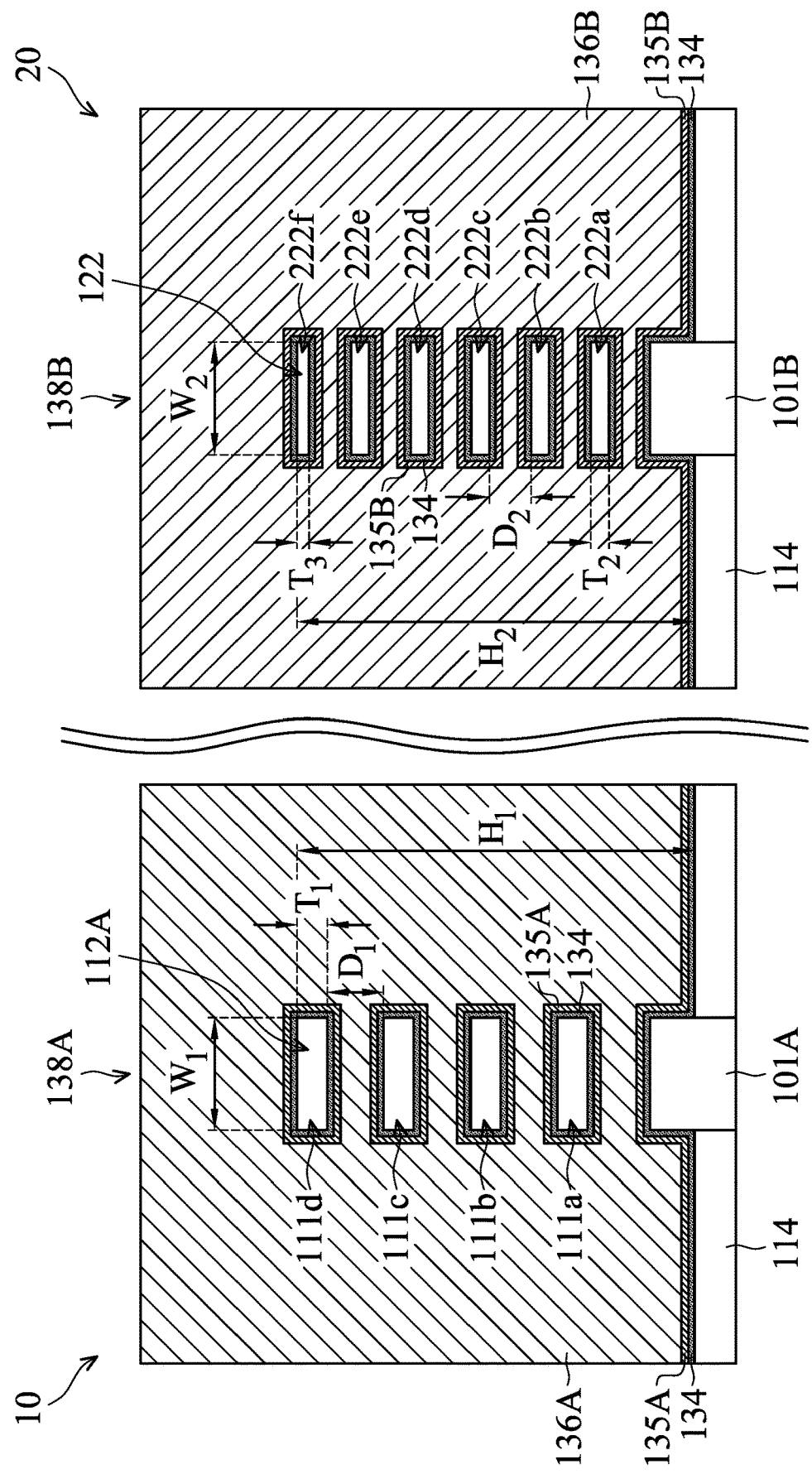
FIG. 4 is a cross-sectional view of a semiconductor device structure, in accordance with some embodiments.

As shown in FIGS. 1N and 3I, metal gate stacks 138A and 138B are formed to fill the trenches 138A and 138B, in accordance with some embodiments. FIG. 4 is a cross-sectional view of a semiconductor device structure, in accordance with some embodiments. In some embodiments, FIG. 4 is an enlarged cross-sectional view partially showing the structure in FIG. 1N. The metal gate stacks 138A and 138B extend into the recesses 310A and 310B to wrap around each of the semiconductor strips 111a-111d of the fin structure 112A and each of the semiconductor strips 222a-222f of the fin structure 122, respectively.

Each of the metal gate stacks 138A and 138B includes multiple metal gate stack layers. The metal gate stacks 138A and 138B may include a gate dielectric layer 134, work function layers 135A and 135B, and conductive fillings 136A and 136B. For clarity, the work function layers 135A and 135B are shown in FIG. 4 but not shown in FIGS. 1N and 3G. In some embodiments, the formation of the metal gate stacks 138A and 138B involves the deposition of multiple metal gate stack layers over the dielectric layer 306 to fill the trenches 308A and 308B. The metal gate stack layers extends into the recesses 310A and 310B to wrap around each of the semiconductor strips 111a-111d of the fin structure 112A and each of the semiconductor strips 222a-222f of the fin structure 122.

In some embodiments, the gate dielectric layer 134 is made of or includes a dielectric material with high dielectric constant (high-K). The gate dielectric layer 134 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 134 may be deposited using an ALD process, a CVD process, one or more other applicable processes, or a combination thereof.

The work function layers 135A and 135B shown in FIG. 4 may be used to provide the desired work function for transistors to enhance device performance including improved threshold voltage. In some embodiments, the work function layer 135A or 135B is used for forming an NMOS device. The work function layer 135A or 135B is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 135A or 135B is used for forming a PMOS device. The work function layer is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layers 135A and/or 135B may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layers 135A and/or 135B may be fine-tuned to adjust the work function level. For example, a titanium nitride layer may be used as a p-type work function layer or an n-type work function layer, depending on the thickness and/or the compositions of the titanium nitride layer.

The work function layer 135A and/or 135B may be deposited over the gate dielectric layer 134 using an ALD process, a CVD process, a PVD process, an electroplating process, an electroless plating process, one or more other applicable processes, or a combination thereof.

In some embodiments, a barrier layer is formed before the work function layer 135A or 135B to interface the gate dielectric layer 134 with subsequently formed work function layer 135A and/or 135B. The barrier layer may also be used to prevent diffusion between the gate dielectric layer 134 and the subsequently formed work function layer 135A or 135B. The barrier layer 120 may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings 136A and 136B are made of or include a metal material. The metal material may include tungsten, aluminum, copper, cobalt, one or more other suitable materials, or a combination thereof. A conductive layer used for forming the conductive fillings 136A and 136B may be deposited over the work function layer 135A or 135B using a CVD process, an ALD process, a PVD process, an electroplating process, an electroless plating process, a spin coating process, one or more other applicable processes, or a combination thereof.

In some embodiments, a blocking layer is formed over the work function layer 135A or 135B before the formation of the conductive layer for forming the conductive fillings 136A and 136B. The blocking layer may be used to prevent the subsequently formed conductive layer from diffusing or penetrating into the work function layer 135A or 135B. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 308A and 308B, in accordance with some embodiments. As a result, the remaining portions of the metal gate stack layers form the metal gate stacks 138A and 138B, as shown in FIGS. 1N, 3I, and 4. In some embodiments, the metal gate stacks 138A and 138B are two separate metal gate stacks. However, embodiments of the disclosure are not limited thereto. Many variations and/or modifications can be made to embodiments of the disclosure. In some other embodiments, the elements 138A and 138B are portions of a single metal gate stack. In these cases, the device structures formed over the regions 10 and 20 share the same metal gate stack.

As shown in FIG. 4, the total surface area of the semiconductor strips 222a-222f of the fin structure 122 is larger than the total surface area of the semiconductor strips 111a-111d of the fin structure 112A. In some embodiments, the device structure formed over the region 20 functions as a capacitor. In some embodiments, one or more conductive structures are formed to form an electrical connection between the epitaxial structures 304B beside the semiconductor strips 222a-222f. As a result, the semiconductor strips 222a-222f together with the connected epitaxial structure 304B may function as a first capacitor electrode. The work function layer 135B and the conductive filling 136B may function as a second capacitor electrode. The gate dielectric layer 134 between the first capacitor electrode and the second capacitor electrode may function as a capacitor dielectric. Since the semiconductor strips 222a-222f of the fin structure 122 has a large surface area, the capacitor may have a sufficient capacitance without occupying too much wafer area.

In some embodiments, the total number of the semiconductor strips 222a-222f of the fin structure 122 is higher than the total number of the semiconductor strips 111a-111d of the fin structure 112A. As shown in FIG. 4, the total number of the semiconductor layers 120a-120f of the fin structure 122 is six that is higher than the total number (i.e., four) of the semiconductor layers 104a-104d of the fin structure 112A.

As shown in FIG. 4, the fin structure 112A has a height $H_1$, and the fin structure 122 has a height $H_2$. In some embodiments, the height $H_1$ is substantially equal to the height $H_2$. The fin structures 112A and 122 are substantially as high as each other. The height $H_1$ or $H_2$ may be in a range from about 35 nm to about 80 nm.

As shown in FIG. 4, the semiconductor strips 111a-111d of the fin structure 112A are separated from each other by a distance $D_1$. The semiconductor strips 222a-222f of the fin structure 122 are separated from each other by a distance $D_2$. In some embodiments, the distance $D_1$ is greater than the distance $D_2$. The distance $D_2$ may be in a range from about 5 nm to about 15 nm.

As shown in FIG. 4, each of the semiconductor strips 111a-111d of the fin structure 112A has a thickness $T_1$. Each of the semiconductor strips 222a-222e of the fin structure 122 has a thickness $T_2$. In some embodiments, the thickness $T_1$ is substantially equal to the thickness $T_2$. The thickness $T_1$ or $T_2$ may be in a range from about 5 nm to about 10 nm.

However, embodiments of the disclosure are not limited thereto. Many variations and/or modifications can be made to embodiments of the disclosure. In some other embodiments, the thickness $T_1$ is greater than the thickness $T_2$.

In some embodiments, the topmost semiconductor layer 120f of the fin structure 122 is formed to be thinner than each of the lower semiconductor layers 120a-120e. As a result, the topmost semiconductor strip 222f formed by the semiconductor layer 120f has a thickness $T_3$ that is thinner than the thickness $T_2$, as shown in FIG. 4 in accordance with some embodiments. Because the topmost semiconductor strip 222f is formed to be thinner, the total height $H_2$ may be maintained substantially as high as the height $H_1$ of the fin structure 112A. Because the fin structures 112A and 122 have substantially the same height, the operations of the subsequent processes may be easier.

As shown in FIG. 4, the fin structure 112A has a width $W_1$, and the fin structure 122 has a width $W_2$. In some embodiments, the widths $W_1$ and $W_2$ are substantially as wide as each other. The width $W_2$ may be in a range from about 20 nm to about 100 nm.

However, embodiments of the disclosure are not limited thereto. Many variations and/or modifications can be made to embodiments of the disclosure. In some other embodiments, the semiconductor fin 122 is formed to be wider than the semiconductor fin 112A. The width $W_2$ is larger than the width $W_1$. In these cases, the total surface area of the semiconductor strips 222a-222f of the fin structure 122 is further increased. As a result, the capacitance of the capacitor formed in the region 20 is increased accordingly.

In some embodiments, by tuning the total number of the semiconductor strips, the thickness of the semiconductor strips, the width of the semiconductor strips, and/or the distance between the semiconductor strips, the capacitance of the capacitor may be enlarged or tuned according to the requirement. The device area occupied by the capacitor is significantly reduced.

Figure 3J:
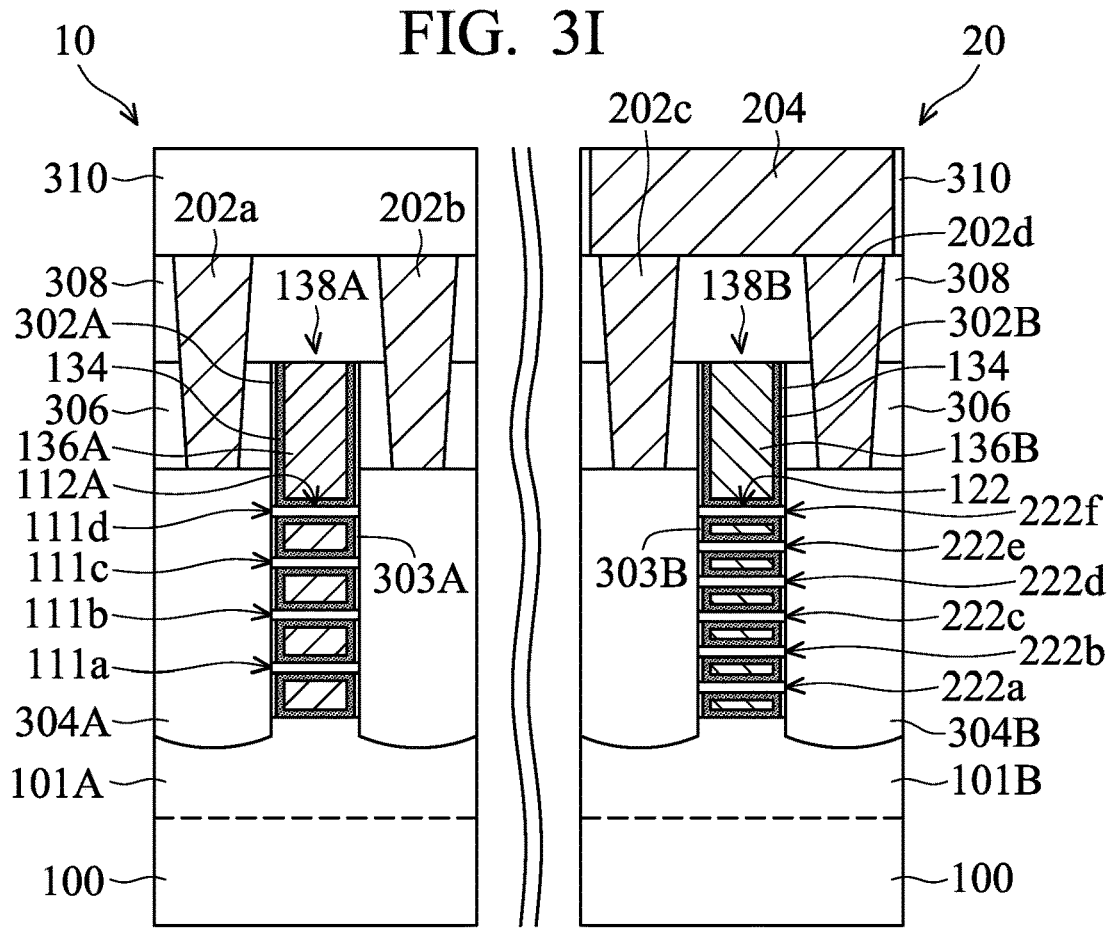

As mentioned above, in some embodiments, one or more conductive structures are formed to form an electrical connection between the epitaxial structures 304B beside the semiconductor strips 222a-222f so as to form a capacitor. FIG. 3J shows an example of the conductive structures.

As shown in FIG. 3J, a dielectric layer 308 is deposited over the structure shown in FIG. 3I, in accordance with some embodiments. The material and formation method of the dielectric layer 308 may be the same as or similar to those of the dielectric layer 306.

Afterwards, conductive contacts 202a, 202b, 202c and 202d are formed in the dielectric layers 306 and 308, as shown in FIG. 3J in accordance with some embodiments. The conductive contacts 202a and 202b are used to provide electrical connection to the epitaxial structures 304A which function as source/drain features. The formation of the conductive contacts 202a, 202b, 202c and 202d may involve contact opening formation, conductive material filling, and planarization process.

Afterwards, a dielectric layer 310 is deposited over the conductive contacts 202a-202d and the dielectric layer 308, as shown in FIG. 3J in accordance with some embodiments. The material and formation method of the dielectric layer 310 may be the same as or similar to those of the dielectric layer 306. Afterwards, a conductive feature 204 is formed in the dielectric layer 306. As a result, the epitaxial structures 304B beside the semiconductor strips 222a-222f are electrically shorted together. In some embodiments, the conductive feature 204, the conductive contacts 202c and 202d, the epitaxial structures 304B, and the semiconductor strips 222a-222f may together function as the first capacitor electrode of the capacitor formed over the region 20.

However, embodiments of the disclosure are not limited thereto. Many variations and/or modifications can be made to embodiments of the disclosure. In some other embodiments, the conductive feature 204 is not formed to electrically connect the conductive contact 202c to the conductive contact 202d. In these cases, the device structure formed over the region 20 may function as a transistor but not a capacitor.

In some embodiments, the fin structure 112B having fewer semiconductor layers is replace with the fin structure 122 having more semiconductor layers. However, embodiments of the disclosure are not limited thereto. Many variations and/or modifications can be made to embodiments of the disclosure. In some other embodiments, a fin structure having more semiconductor layers (or more semiconductor strips) is replaced with a fin structure having fewer semiconductor layers (or fewer semiconductor strips).

Figure 5A:
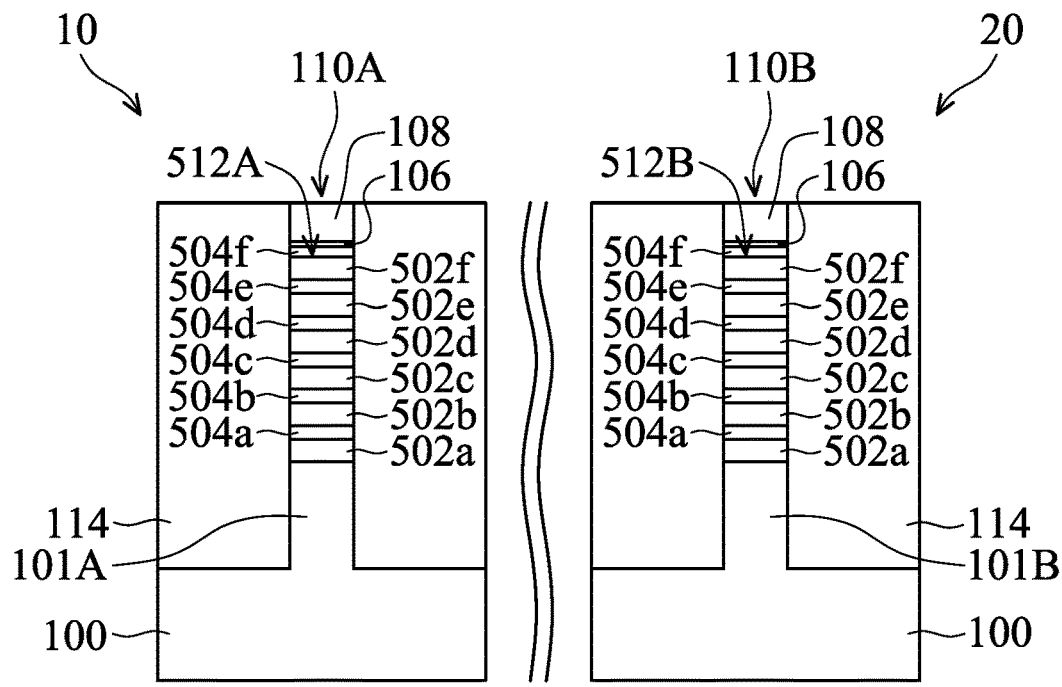
FIGS. 5A-5E are cross-sectional views of various stages of a process for forming a semiconductor device structure, in accordance with some embodiments.

FIGS. 5A-5E are cross-sectional views of various stages of a process for forming a semiconductor device structure, in accordance with some embodiments. As shown in FIG. 5A, similar to the embodiments illustrated in FIGS. 1A-1B, fin structures 512A and 512B are respectively formed over the regions 10 and 20 of the semiconductor substrate 100 and are surrounded by the isolation structure 114, in accordance with some embodiments. Each of the fin structures 512A and 512B has multiple sacrificial layers 502a-502f and multiple semiconductor layers 504a-504f that are laid out alternately. The material and formation method of the sacrificial layers 502a-502f may be the same as or similar to those of the sacrificial layers 102a-102d shown in FIG. 1A. The material and formation method of the semiconductor layers 504a-504f may be the same as or similar to those of the semiconductor layers 104a-104d shown in FIG. 1A.

Figure 5B:
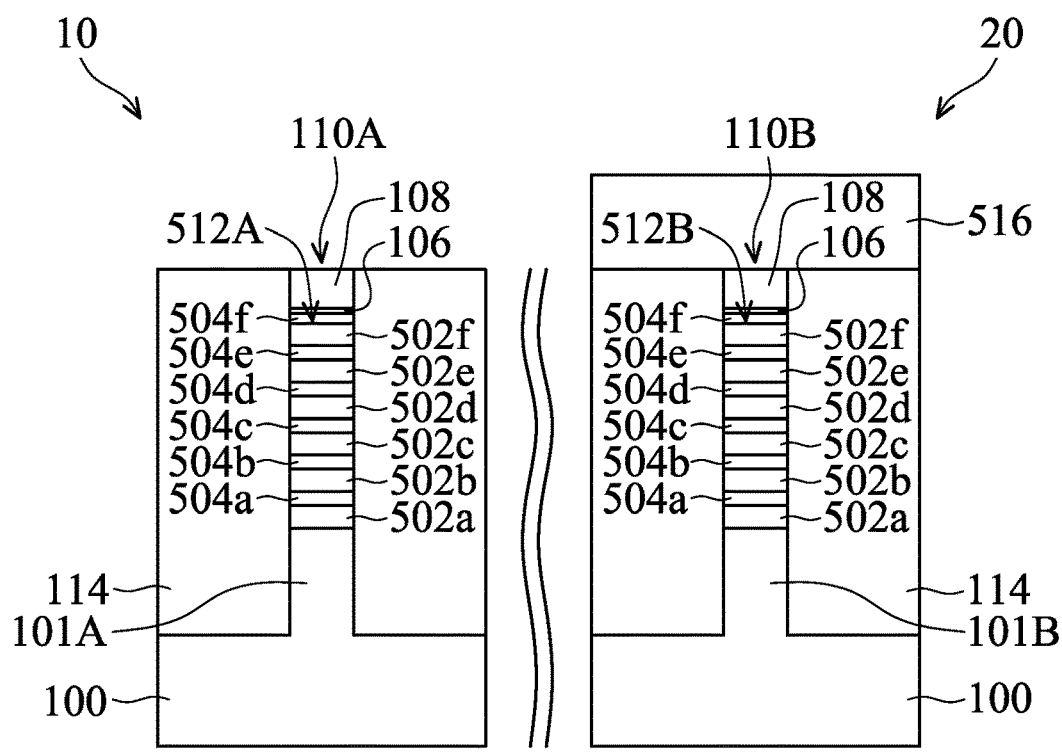

As shown in FIG. 5B, similar to the embodiments illustrated in FIG. 1C, a mask element 516 is formed to cover the fin structure 512B and a portion of the isolation structures 114, in accordance with some embodiments. Meanwhile, the hard mask element 110A over the fin structure 512A and a portion of the isolation structure 114 surrounding the fin structure 512A are exposed without being covered by the mask element 516. In some embodiments, the mask element 516 is a patterned photoresist element.

Figure 5C:
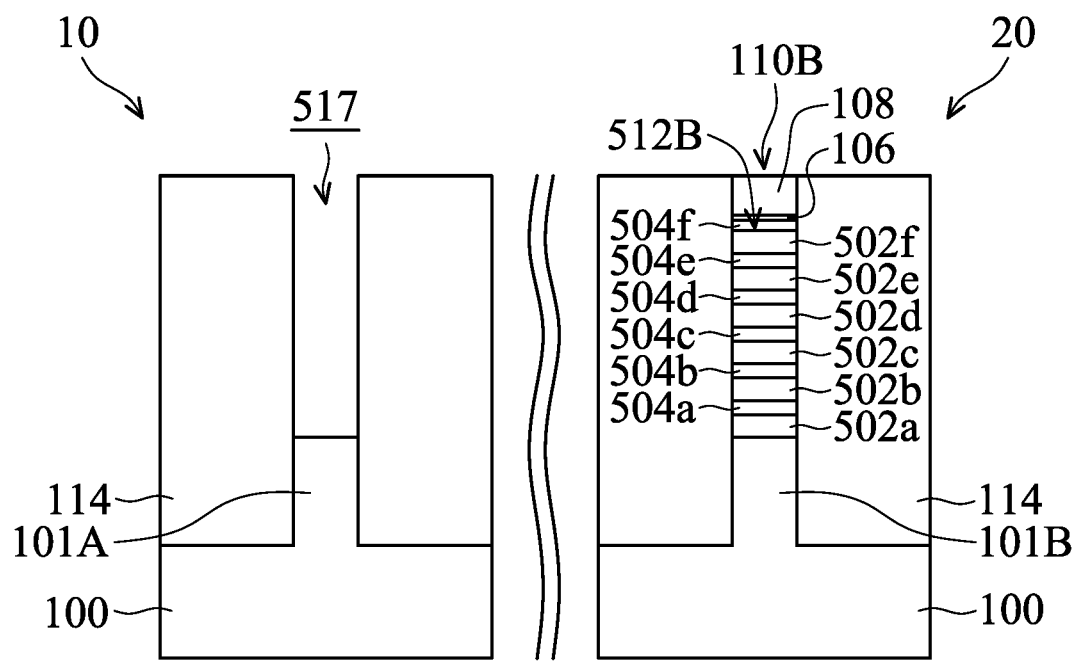

As shown in FIG. 5C, similar to the embodiments illustrated in FIGS. 1D-1E, the hard mask element 110A and the fin structure 512A are removed to form a trench 517 surrounded by the isolation structure 114, in accordance with some embodiments. One or more etching processes may be used to form the trench 517.

Figure 5D:
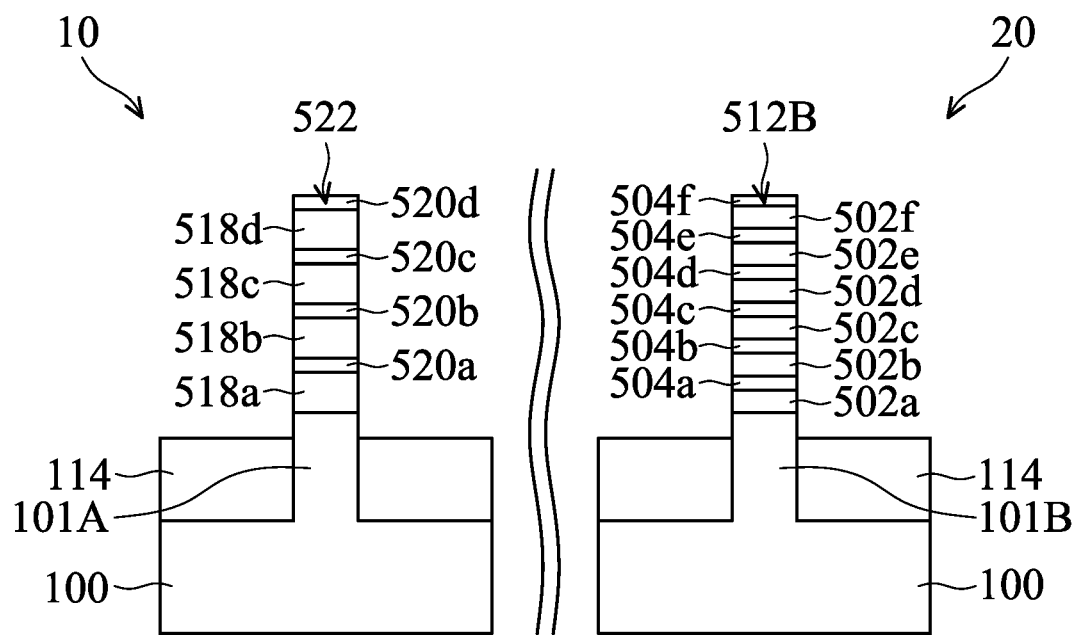

As shown in FIG. 5D, similar to the embodiments illustrated in FIGS. 1F-1J, a fin structure 522 is formed over the protruding structure 101A, and the isolation structure 114 is partially removed, in accordance with some embodiments. The fin structure 512A is thus replaced with the fin structure 522.

In some embodiments, the fin structure 522 has multiple sacrificial layers 518a-518d and multiple semiconductor layers 520a-520d that are laid out alternately. The material and formation method of the sacrificial layers 518a-518d may be the same as or similar to those of the sacrificial layers 118a-118f shown in FIG. 1F. The material and formation method of the semiconductor layers 520a-520d may be the same as or similar to those of the sacrificial layers 120a-120f shown in FIG. 1F. The total number of the semiconductor layers 520a-520d of the fin structure 522 is less than the total number of the semiconductor layers 504a-504f of the fin structure 512A.

Figure 5E:
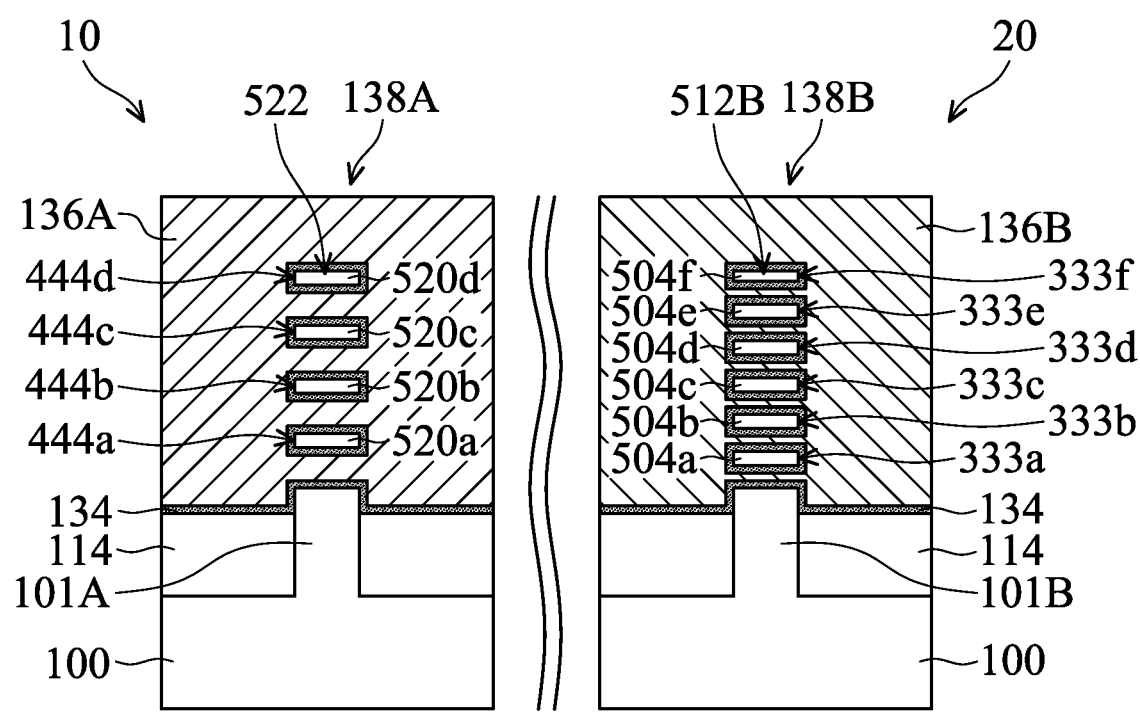

As shown in FIG. 5E, processes similar to the embodiments illustrated in FIGS. 1K-1N are performed to form the metal gate stacks 138A and 138B, in accordance with some embodiments. The metal gate stack 138A wraps around semiconductor strips 444a-444d that are formed by the semiconductor layers 520a-520d. The metal gate stack 138B wraps around semiconductor strips 333a-333f that are formed by the semiconductor layers 504a-504f.

In some embodiments, conductive structure similar to the conductive contacts 202c and 202d and the conductive feature 204 are formed to form an electrical connection between the epitaxial structures beside the semiconductor strips 333a-333f. In these cases, the device structure over the region 20 may function as a capacitor. In some other embodiments, the conductive feature 204 is not formed to form an electrical connection between the epitaxial structures beside the semiconductor strips 333a-333f. In these cases, the device structure over the region 20 may function as a transistor.

Embodiments of the disclosure form a semiconductor device structure with two or more fin structures each includes multiple semiconductor strips. One of the fin structures is replaced with a new fin structure that has more or fewer semiconductor strips than the original fin structure. Therefore, interface area between the semiconductor strips and a subsequently formed metal gate stack may be enlarged or tuned, which allows the performance of the semiconductor device structure to be enhanced. For example, the new fin structure functions as a portion of a capacitor. The enlarged interface area between the semiconductor strips and the metal gate stack may provide the capacitor with a larger capacitance without occupying more wafer area. The performance and reliability of the semiconductor device structure are greatly improved.

In accordance with some embodiments, a method for forming a semiconductor device structure is provided. The method includes forming a semiconductor stack having first sacrificial layers and first semiconductor layers laid out alternately. The method also includes patterning the semiconductor stack to form a first fin structure and a second fin structure. The method further includes replacing the second fin structure with a third fin structure having second sacrificial layers and second semiconductor layers laid out alternately. In addition, the method includes removing the first sacrificial layers in the first fin structure and the second sacrificial layers in the third fin structure. The method includes forming a first metal gate stack and a second metal gate stack to wrap around each of the first semiconductor layers in the first fin structure and each of the second semiconductor layers in the third fin structure, respectively.

In accordance with some embodiments, a method for forming a semiconductor device structure is provided. The method includes forming a first fin structure and a second fin structure each having sacrificial layers and semiconductor layers laid out alternately. A total interface area between the sacrificial layers and the semiconductor layers in the second fin structure is larger than a total interface area between the sacrificial layers and the semiconductor layers in the first fin structure. The method also includes removing the sacrificial layers in the first fin structure and the second fin structure. The method further includes forming one or more metal gate stacks to wrap around each of the semiconductor layers in the first fin structure and each of the semiconductor layers in the second fin structure.

In accordance with some embodiments, a semiconductor device structure is provided. The semiconductor device structure includes a first fin structure having first semiconductor strips separated from each other. The semiconductor device structure also includes a second fin structure having second semiconductor strips separated from each other. A total surface area of the second semiconductor strips of the second fin structure is larger than a total surface area of the first semiconductor strips of the first fin structure. The semiconductor device structure further includes a first metal gate stack wrapping around each of the first semiconductor strips. In addition, the semiconductor device structure includes a second metal gate stack wrapping around each of the second semiconductor strips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a first structure having a plurality of first semiconductor strips separated from each other;
    a second structure having a plurality of second semiconductor strips separated from each other, wherein a total surface area of the second semiconductor strips of the second structure is larger than a total surface area of the first semiconductor strips of the first structure, and a topmost second semiconductor strip of the second semiconductor strips is thinner than two or more of lower semiconductor strips of the second semiconductor strips;
    a first metal gate stack wrapping around each of the first semiconductor strips; and
    a second metal gate stack wrapping around each of the second semiconductor strips.

2. The semiconductor device structure as claimed in claim 1, wherein a total number of the second semiconductor strips is higher than a total number of the first semiconductor strips.

3. The semiconductor device structure as claimed in claim 1, wherein two neighboring semiconductor strips of the first semiconductor strips are separated from each other by a first distance, two neighboring semiconductor strips of the second semiconductor strips are separated from each other by a second distance, and the first distance is greater than the second distance.

4. The semiconductor device structure as claimed in claim 1, wherein the first structure and the second structure are substantially as high as each other.

5. The semiconductor device structure as claimed in claim 1, further comprising:
    a first epitaxial structure and a second epitaxial structure, wherein the second semiconductor strips are sandwiched between the first epitaxial structure and the second epitaxial structure;
    a first conductive contact electrically connected to the first epitaxial structure;
    a second conductive contact electrically connected to the second epitaxial structure; and
    a conductive structure electrically connected to the first conductive contact and the second conductive contact.

6. The semiconductor device structure as claimed in claim 1, further comprising:
    a first epitaxial structure and a second epitaxial structure, wherein the second semiconductor strips are sandwiched between the first epitaxial structure and the second epitaxial structure, and the first epitaxial structure is electrically connected to the second epitaxial structure.

7. The semiconductor device structure as claimed in claim 6, further comprising:
    a third epitaxial structure and a fourth epitaxial structure, wherein the first semiconductor strips are sandwiched between the third epitaxial structure and the fourth epitaxial structure.

8. The semiconductor device structure as claimed in claim 1, wherein each of the second semiconductor strips is thinner than each of the first semiconductor strips.

9. The semiconductor device structure as claimed in claim 1, wherein the topmost second semiconductor strip of the second semiconductor strips is thinner than each of the lower semiconductor strip of the second semiconductor strips.

10. The semiconductor device structure as claimed in claim 1, wherein the first semiconductor strips and the second semiconductor strips are made of a same material.

11. A semiconductor device structure, comprising:
a plurality of first semiconductor nanostructures over a substrate;
a plurality of second semiconductor nanostructures over the substrate, wherein a total number of the second semiconductor nanostructures is higher than a total number of the first semiconductor nanostructures, and a topmost second semiconductor nanostructure of the second semiconductor nanostructures is thinner than two or more of lower semiconductor nanostructures of the second semiconductor nanostructures;
a first metal gate stack wrapping around the first semiconductor nanostructures; and
a second metal gate stack wrapping around the second semiconductor nanostructures.

12. The semiconductor device structure as claimed in claim 11, wherein the topmost second semiconductor nanostructure of the second semiconductor nanostructures is thinner than each of the lower semiconductor nanostructures of the second semiconductor nanostructures.

13. The semiconductor device structure as claimed in claim 11, wherein a topmost surface of the first semiconductor nanostructures is substantially level with a topmost surface of the second semiconductor nanostructures.

14. The semiconductor device structure as claimed in claim 11, wherein the first metal gate stack between two neighboring semiconductor nanostructures of the first semiconductor nanostructures is thicker than the second metal gate stack between two neighboring semiconductor nanostructures of the second semiconductor nanostructures.

15. The semiconductor device structure as claimed in claim 11, wherein each of the second semiconductor nanostructures is thinner than each of the first semiconductor nanostructures.

16. A semiconductor device structure, comprising:
a plurality of first semiconductor nanostructures over a substrate;
a plurality of second semiconductor nanostructures over the substrate, wherein a total number of the second semiconductor nanostructures is different than a total number of the first semiconductor nanostructures, and a topmost second semiconductor nanostructure of the second semiconductor nanostructures is thinner than two or more of lower semiconductor nanostructures of the second semiconductor nanostructures;
a first metal gate stack wrapping around the first semiconductor nanostructures; and
a second metal gate stack wrapping around the second semiconductor nanostructures.

17. The semiconductor device structure as claimed in claim 16, wherein the topmost second semiconductor nanostructure of the second semiconductor nanostructures is thinner than each of the lower semiconductor nanostructures of the second semiconductor nanostructures.

18. The semiconductor device structure as claimed in claim 16, wherein two neighboring semiconductor nanostructures of the first semiconductor nanostructures are separated from each other by a first distance, two neighboring semiconductor nanostructures of the second semiconductor nanostructures are separated from each other by a second distance, and the first distance is different than the second distance.

19. The semiconductor device structure as claimed in claim 16, further comprising:
a first epitaxial structure and a second epitaxial structure, wherein the second semiconductor nanostructures are sandwiched between the first epitaxial structure and the second epitaxial structure, and the first epitaxial structure is electrically connected to the second epitaxial structure.

20. The semiconductor device structure as claimed in claim 16, wherein each of the second semiconductor nanostructures is thinner than each of the first semiconductor nanostructures.

* * * * *